US009876044B2

(12) United States Patent
Lee et al.

(10) Patent No.: US 9,876,044 B2
(45) Date of Patent: Jan. 23, 2018

(54) IMAGE SENSOR AND METHOD OF MANUFACTURING THE SAME

(71) Applicant: SAMSUNG ELECTRONICS CO., LTD., Suwon-si, Gyeonggi-Do (KR)

(72) Inventors: Yun-ki Lee, Seoul (KR); Kyung-duck Lee, Seoul (KR); Min-wook Jung, Yongin-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/372,437

(22) Filed: Dec. 8, 2016

(65) Prior Publication Data

US 2017/0170216 A1 Jun. 15, 2017

(30) Foreign Application Priority Data

Dec. 15, 2015 (KR) ........................ 10-2015-0179206

(51) Int. Cl.
*H01L 31/0203* (2014.01)
*H01L 27/146* (2006.01)

(52) U.S. Cl.
CPC ...... *H01L 27/1463* (2013.01); *H01L 27/1464* (2013.01); *H01L 27/14621* (2013.01); *H01L 27/14627* (2013.01); *H01L 27/14636* (2013.01); *H01L 27/14645* (2013.01); *H01L 27/14685* (2013.01)

(58) Field of Classification Search
CPC ........... H01L 27/1463; H01L 27/14645; H01L 27/14636; H01L 27/14685; H01L 27/14627; H01L 27/1464; H01L 27/14621
USPC ............................................ 257/432; 438/65
See application file for complete search history.

(56) References Cited

U.S. PATENT DOCUMENTS

| | | | |
|---|---|---|---|
| 8,274,122 B2 | 9/2012 | Shimotsusa | |
| 8,354,292 B2 | 1/2013 | Park et al. | |
| 8,378,399 B2 | 2/2013 | Maeda | |
| 8,704,324 B2 | 4/2014 | Hiyama et al. | |
| 8,854,529 B2 | 10/2014 | Yoshimura et al. | |
| 8,896,036 B2 | 11/2014 | Mabuchi | |
| 8,928,795 B2 | 1/2015 | Kusaka | |
| 2014/0071244 A1 | 3/2014 | Hirota | |
| 2014/0077323 A1* | 3/2014 | Velichko | H01L 27/14627 257/432 |
| 2014/0160335 A1* | 6/2014 | Shimotsusa | H01L 27/1463 348/311 |
| 2015/0155327 A1 | 6/2015 | Kuboi | |
| 2016/0111457 A1 | 4/2016 | Sekine | |

FOREIGN PATENT DOCUMENTS

JP 5604703 B1 10/2014

* cited by examiner

*Primary Examiner* — Vu A Vu
(74) *Attorney, Agent, or Firm* — Lee & Morse, P.C.

(57) ABSTRACT

An image sensor includes a semiconductor layer including a first surface and a second surface, which are opposite to each other. A plurality of unit pixels is in the semiconductor layer. Each of the unit pixels includes a first photoelectric converter and a second photoelectric converter. A first isolation layer isolates adjacent unit pixels from one another. A second isolation layer is between the first photoelectric converter and the second photoelectric converter. The first isolation layer has a different shape from the second isolation layer.

18 Claims, 26 Drawing Sheets

IMAGE SENSOR AND METHOD OF MANUFACTURING THE SAME

CROSS-REFERENCE TO RELATED APPLICATION

Korean Patent Application No. 10-2015-0179206, filed on Dec. 15, 2015, in the Korean Intellectual Property Office, and entitled: "Image Sensor and Method of Manufacturing the Same," is incorporated by reference herein in its entirety.

BACKGROUND

1. Field

Embodiments relate to an image sensor and a method of manufacturing the same, and more particularly, to a back-side-illumination-type image sensor and a method of manufacturing the same.

2. Description of the Related Art

An image sensor may convert an optical image signal into an electric signal. The image sensor may be used not only for typical electronic devices for consumers, such as digital cameras, cameras for cellular phones, and portable camcorders, but also for cameras mounted on automobiles, security devices, and robots. However, occurrence of crosstalk in the image sensor may degrade resolution of an image obtained by using the image sensor and also, deteriorate autofocus (AF) performance of the image sensor.

SUMMARY

One or more embodiments provide an image sensor including a semiconductor layer including a first surface and a second surface, which are opposite to each other, a plurality of unit pixels located in the semiconductor layer, each unit pixel including a first photoelectric converter and a second photoelectric converter, a first isolation layer configured to isolate adjacent unit pixels from one another, and a second isolation layer located between the first photoelectric converter and the second photoelectric converter. The first isolation layer has a different shape from the second isolation layer.

One or more embodiments provide an image sensor including a substrate, e.g., a silicon substrate, including a first surface and a second surface, which are opposite to each other, the silicon substrate including a pixel array region in which a plurality of unit pixels are arranged, a pixel isolation region formed by filling an isolation trench with an insulating material, the pixel isolation region configured to isolate adjacent unit pixels from one another, an interconnection layer on the first surface of the silicon substrate, and a color filter layer and an ML layer on the second surface of the silicon substrate. Each of the unit pixels includes at least two photoelectric converters and a device isolation region formed between the first surface and the second surface of the silicon substrate, and the pixel isolation region has a different width or depth from the device isolation region.

One or more embodiments provide an image sensor including a semiconductor layer including a first surface and a second surface, which are opposite to each other, a plurality of unit pixels in the semiconductor layer between the first and second surfaces, each unit pixel including a first photoelectric converter and a second photoelectric converter, a first isolation layer to isolate adjacent unit pixels from one another, the first isolation layer extending between the first and second surfaces, and a device isolation layer between the first photoelectric converter and the second photoelectric converter, the device isolation layer extending between the first and second surfaces. The first isolation layer has a different form factor from the device isolation layer.

BRIEF DESCRIPTION OF THE DRAWINGS

Features will become apparent to those of skill in the art by describing in detail exemplary embodiments with reference to the attached drawings in which.

DETAILED DESCRIPTION

An image sensor, which will be described below, may have various configurations. Here, examples of only required elements of the image sensor will be presented, and embodiments are not limited thereto.

Figure 1:
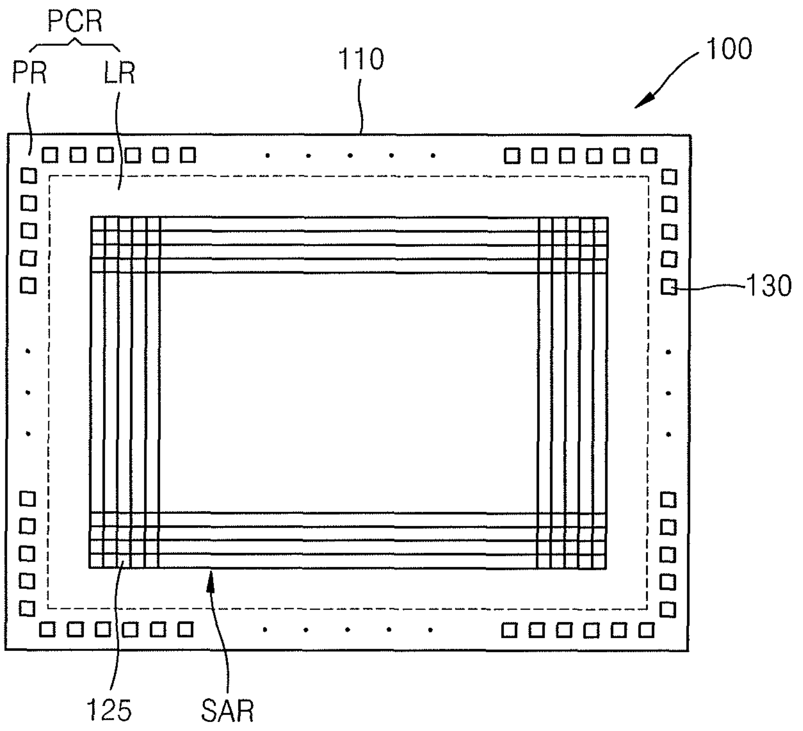
FIG. 1 illustrates a plan view of an image sensor according to an embodiment.

FIG. 1 is a plan view of an image sensor 100 according to an embodiment. Specifically, the image sensor 100 may include a pixel array region SAR (or a sensor array region), a logic region LR, and a pad region PR, which are formed on a semiconductor substrate 110.

The semiconductor substrate 110 may include, for example, silicon (Si). Alternatively, the semiconductor substrate 110 may include a semiconductor element, such as germanium (Ge), or a compound semiconductor, such as silicon carbide (SiC), gallium arsenide (GaAs), indium arsenide (InAs), and indium phosphide (InP).

The semiconductor substrate 110 may have a silicon-on-insulator (SOI) or a buried oxide layer (BOX) layer. The semiconductor substrate 110 may include a may include a conductive layer, for example, a doped well or a doped structure. The image sensor 100 may be, for example, a complementary metal-oxide-semiconductor (CMOS) image sensor (CIS).

The pixel array region SAR may include a plurality of unit pixels 125 arranged in a matrix. The logic region LR may be located along edges of the pixel array region SAR. Although the logic region LR is illustrated as located along all four edges of the pixel array region SAR, the inventive concept is not limited thereto. For example, the logic region LR may be located along two edges or three edges of the pixel array region SAR.

The logic region LR may include electronic devices including a plurality of transistors. The logic region LR may provide a predetermined signal to each of the unit pixels 125 of the pixel array region SAR or control an output signal of the pixel array region SAR. The logic region LR may include, for example, a timing generator, a row decoder, a row driver, a correlated double sampler (CDS), an analog-to-digital converter (ADC), a latch, and/or a column decoder.

The plurality of unit pixels 125 included in the pixel array region SAR may be driven in response to a plurality of driving signals (e.g., a row selection signal, a reset signal, and a charge transmission signal) from the row driver. Also, electric output signals generated due to a photoelectric conversion operation by the plurality of unit pixels 125 may be provided to the CDS. The timing generator may provide a timing signal and a control signal to the row decoder and the column decoder.

The row driver may provide a plurality of driving signals for driving the plurality of unit pixels 125 based on decoding results of the row decoder. When the plurality of unit pixels 125 are arranged in a matrix, the row decoder may provide a driving signal to each of rows of the matrix. The CDS may receive an output signal from each of the plurality of unit pixels 125 and maintain and sample the output signal. That is, the CDS may doubly sample a specific noise level and a signal level of the output signal and output a difference level corresponding to a difference between the noise level and the signal level.

The ADC may convert an analog signal corresponding to the difference level into a digital signal and output the digital signal. The latch may latch the digital signal, and latched signals may be sequentially output based on decoding results of the column decoder.

The unit pixel 125 may be, for example, a passive pixel sensor or an active pixel sensor. The unit pixel 125 may include, for example, a photoelectric converter configured to sense light, a transfer transistor to transmit charges generated by the photoelectric converter, a reset transistor to periodically reset a floating diffusion region configured to store the transmitted charges, and a source follower to buffer a signal corresponding to the charges stored in the floating diffusion region.

Each of the unit pixels 125 may include at least two photoelectric converters, which are independent of one another. The image sensor 100 may include a pixel isolation layer to increase a degree of isolation between the unit pixels 125. The image sensor 100 may include a device isolation layer to increase a degree of isolation between the photoelectric converters included in each of the unit pixels 125.

The pad region PR may include a plurality of pads 130 used to exchange electric signals with an external apparatus or a package base substrate. The pad region PR may be located around the pixel array region SAR. The plurality of pads 130 formed in the pad region PR may be electrically connected to the unit pixel 125 and located along a circumference of the pixel array region SAR. The plurality of pads 130 may include, for example, a metal, a metal nitride, or a combination thereof. A conductive interconnection and a conductive plug may be formed on the semiconductor substrate 110 to electrically connect the plurality of pads 130 with the electronic devices included in the logic region LR and the plurality of unit pixels 125 included in the pixel array region SAR. The conductive interconnection and the conductive plug may include, for example, a metal, a metal nitride, or a combination thereof.

As contrasted with the pixel array region SAR, the logic region LR and the pad region PR may be referred to together as a peripheral circuit region PCR. The peripheral circuit region PCR may refer to a region other than the pixel array region SAR in the semiconductor substrate 110 included in the image sensor 100.

Figure 2:
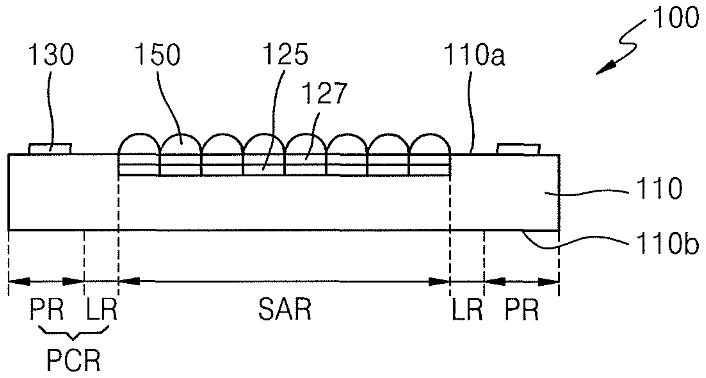
FIG. 2 illustrates a cross-sectional view of an image sensor according to an embodiment.

FIG. 2 is a cross-sectional view of an image sensor 100 according to an embodiment.

Specifically, the image sensor 100 may include a pixel array region SAR (or a sensor array region), a logic region LR, and a pad region PR, which are formed on a semiconductor substrate 110. The semiconductor substrate 110 may have a first surface 110*a* and a second surface 110*b*, which are opposite to each other along a first direction. The first surface 110*a* of the semiconductor substrate 110 may be a bottom surface or a top surface of the semiconductor substrate 110. The second surface 110*b* of the semiconductor substrate 110 may be the top surface or the bottom surface of the semiconductor substrate 110.

The pixel array region SAR may include a plurality of unit pixels 125 arranged as a matrix type. The plurality of unit pixels 125 may be separated from one another by a pixel isolation layer. The plurality of unit pixels 125 and a plurality of pads 130 may be formed on the first surface 110*a* of the semiconductor substrate 110. A plurality of color filter layers 127 and a plurality of microlens (ML) layers 150 may be sequentially formed on the plurality of unit pixels 125.

In this case, each of the unit pixels 125 may include at least two photoelectric converters. The at least two photoelectric converters may be separated from one another by a device isolation layer.

The plurality of color filter layers 127 may include, for example, a red (R) filter, a blue (B) filter, and a green (G) filter. Alternatively, the plurality of color filter layers 127 may include a cyan (C) filter, a yellow (Y) filter, and a magenta (M) filter. One color filter layer 127 of the R, B, and G filters or one color filter layer 127 of C, Y, and M filters may be formed on each of the unit pixels 125 so that each of the unit pixels 125 may sense an element of incident light and recognize one color.

The plurality of ML layers 150 may condense, i.e., focus, the incident light of the pixel array region SAR toward the unit pixel 125. When the unit pixel 125 includes a photoelectric converter (e.g., a photodiode), the plurality of ML layers 150 may condense the incident light of the pixel array region SAR toward the photoelectric converter of the unit pixel 125.

Figure 3:
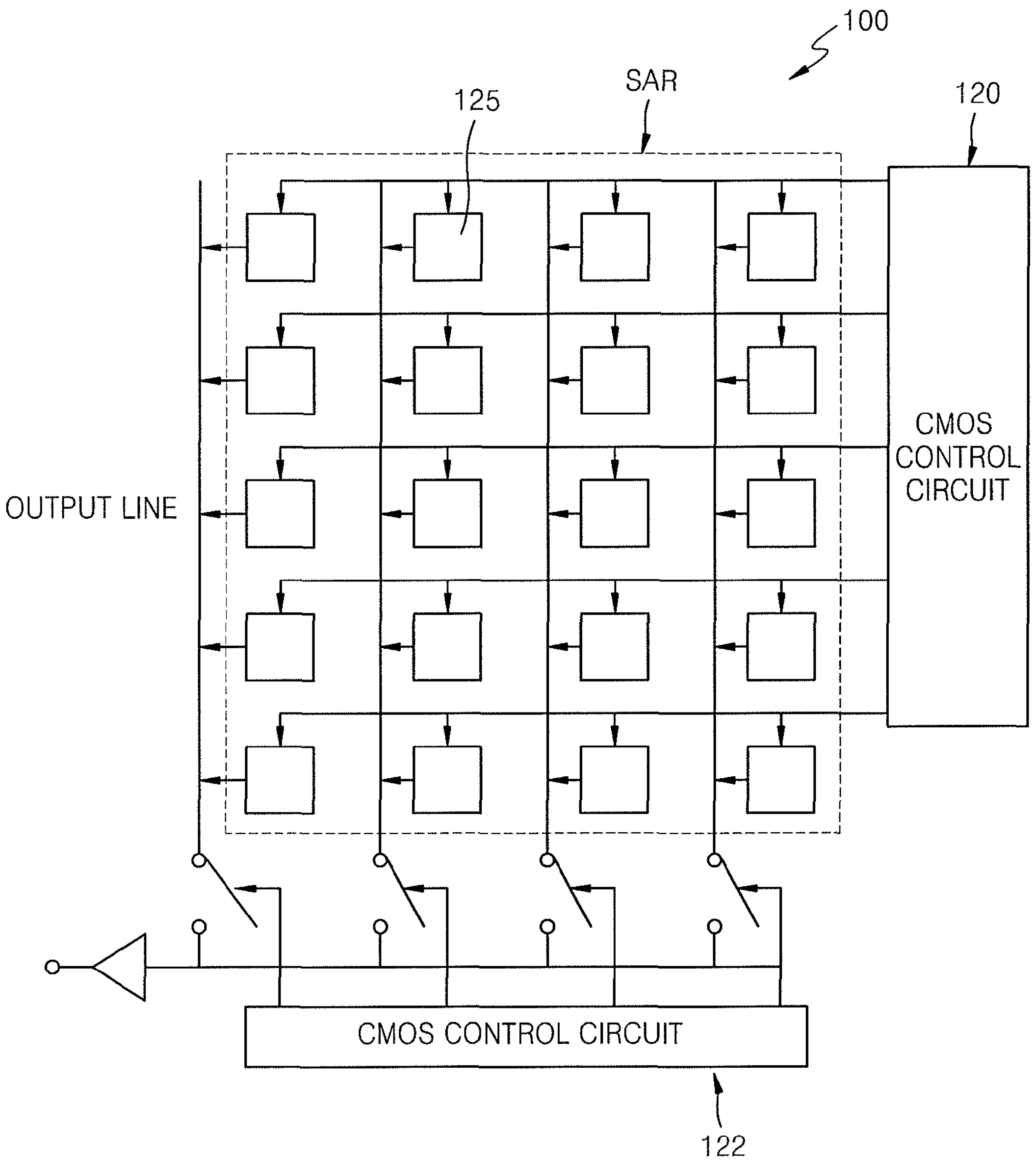
FIG. 3 illustrates a schematic block diagram of an image sensor according to an embodiment.

FIG. 3 is a schematic block diagram of an image sensor 100 according to an embodiment.

The image sensor 100 may include a pixel array region SAR and CMOS control circuits 120 and 122. The pixel array region SAR may include a plurality of unit pixels arranged in a matrix. The CMOS control circuits 120 and 122 may be located around the pixel array region SAR and include a plurality of CMOS transistors.

Each of the unit pixels 125 may include at least two photoelectric converters. The CMOS control circuits 120 and 122 may provide a predetermined signal to each of the photoelectric converters or control output signals of the photoelectric converters.

For example, the CMOS control circuit 120 may include a row driver, and the CMOS control circuit 122 may include a correlated double sampler (CDS), a comparator, and an ADC. Here, a structure of the unit pixel 125 may vary according to an element included in the unit pixel 125, and a unit pixel including 1 to 5 transistors may be widely applied.

Figure 4:
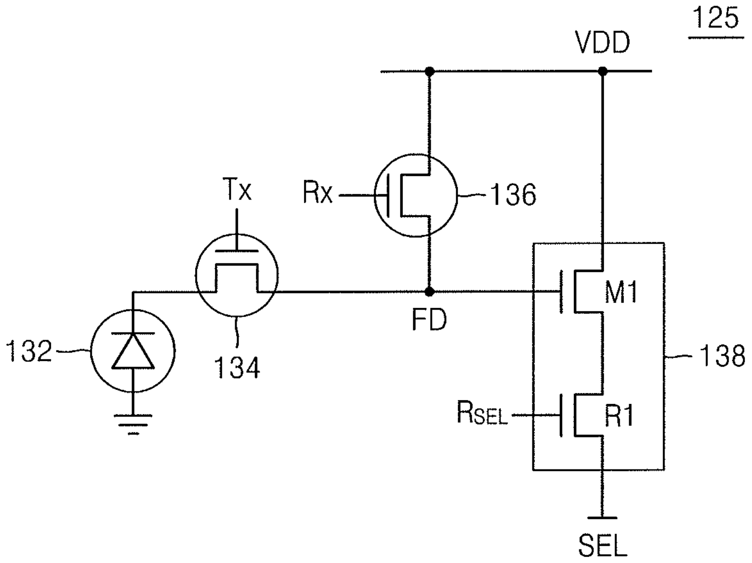
FIG. 4 illustrates a circuit diagram of a portion of a unit pixel according to an embodiment.
Figure 5:
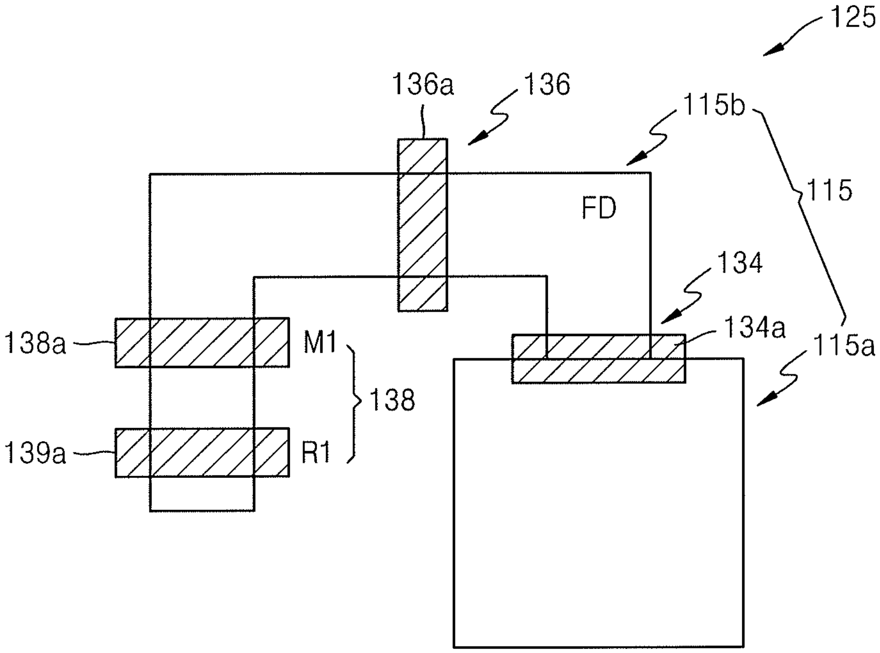
FIG. 5 illustrates a plan view of the portion of the unit pixel of FIG. 4, which is formed on a semiconductor substrate, according to an embodiment.

FIG. 4 is a circuit diagram of a portion of a unit pixel 125 according to an embodiment. FIG. 5 is a plan view of the portion of the unit pixel of FIG. 4, which is formed on a semiconductor substrate, according to an embodiment.

Specifically, as shown in FIG. 4, the unit pixel 125 may include a photoelectric converter 132 to sense light, a transfer transistor Tx (or 134) to transmit charges generated by the photoelectric converter 132, a reset transistor Rx (or 136) to periodically reset a floating diffusion region FD to store the received charges, and a source follower 138 to buffer a signal corresponding to the charges stored in the floating diffusion region FD. Each of the unit pixels 125 may include a plurality of photoelectric converters 132, and transfer transistors 134, reset transistors 136, and source followers 138 may be provided in equal number to the plurality of photoelectric converters 132.

The source follower 138 may include two MOS transistors M1 and R1, which are connected in series. One end of the reset transistor 136 and one end of the MOS transistor M1 may be connected to a power supply voltage VDD. A gate electrode of the MOS transistor R1 may be connected to a row selection signal line RSEL, and one end of the MOS transistor R1 may be connected to a column selection line SEL.

As shown in FIG. 5, the unit pixel 125 may be integrated on the semiconductor substrate. That is, an active region 115 may be formed on the semiconductor substrate. The active region 115 may include a photoelectric converter region 115*a* and a transistor region 115*b*. For example, the photoelectric converter region 115*a* may be formed as a square plate type to occupy a predetermined portion of the semiconductor substrate (refer to 110 in FIG. 2), which is defined by the unit pixel 125.

The transistor region 115*b* may be in contact with one surface of the photoelectric converter 115*a* and have a line shape having at least one bent portions. A gate electrode 134*a* of the transfer transistor 134, a gate electrode 136*a* of the reset transistor 136, gate electrodes 138*a* and 139*a* of the source follower 138 may be formed in the transistor region 115*b*.

Each of the unit pixels 125 may include at least two photoelectric converter regions 115*a*, which are isolated from one another by a device isolation layer, and at least two transistor regions 115*b*. The at least two photoelectric converter regions 115*a* may be connected to different transistor regions 115*b*, respectively.

The image sensor having the above-described structure and circuit may be mounted on an image capturing apparatus, such as a camera or a camcorder, and used to obtain images of an object or utilized as an auto focus sensor. For example, the image sensor may compare at least two signals generated by at least two photoelectric converters included in each of the unit pixels 125 and form an autofocus (AF) image using a phase difference detection method. When the AF image is not formed, the image sensor may obtain image information by using at least two signals obtained by each of the unit pixels 125.

Figure 6A:
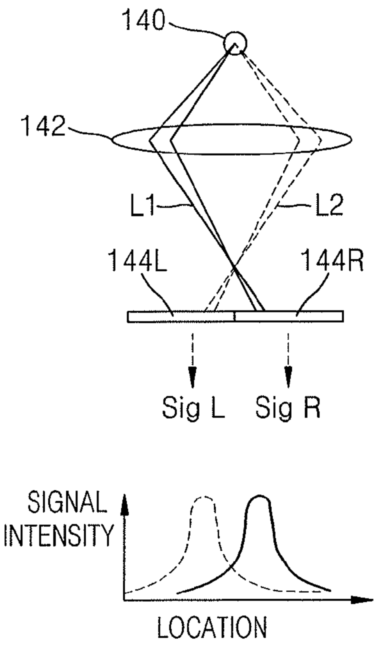
FIGS. 6A to 6C illustrate diagrams for explaining a photo detection method used for an image sensor according to an embodiment.
Figure 6B:
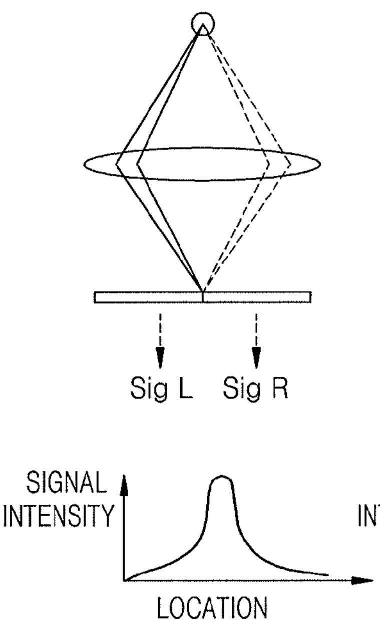
Figure 6C:
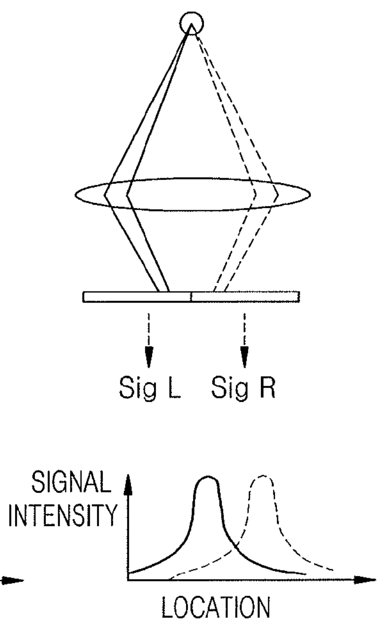

FIG. 6A to 6C illustrate diagrams for explaining a phase detection method used for an image sensor according to an embodiment. Referring to FIG. 6A to 6C, light incident from an object 140 may be incident through a lens 142 to photoelectric converters (e.g., first and second photoelectric converters 144L and 144R) of the image sensor. In the phase detection method, light incident from the object 140 may be divided into two beams of light, and phases of the divided beams of light may be compared with each other to form an AF image.

For example, the first and second photoelectric converters 144L and 144R may be independent of each other. During an AF operation, the first photoelectric converter 144L and the second photoelectric converter 144R on which light is incident may output a first signal Sig L and a second signal Sig R.

As shown in FIG. 6A, foci of light beams L1 and L2 incident from an object 140 may be formed in front of the first and second photoelectric converters 144L and 144R. An AF operation may be performed by moving the lens 142 toward the first and second photoelectric converters 144L and 144R by using a distance by which the lens 142 moves, and the distance may be calculated by comparing a first signal Sig L with a second signal Sig R. As a result, as shown in FIG. 6B, when a first signal Sig L and a second signal Sig R output by the first photoelectric converter 144L and the second photoelectric converter 144R due to light beams L1 and L2 incident from an object 140 are identical, an AF image may be formed.

In contrast, as shown in of FIG. 6C, foci of light beams L1 and L2 incident from an object 140 may be formed behind the first and second photoelectric converters 144L and 144R. An AF operation may be performed by moving the lens 142 toward the object 140 by using a distance by which the lens 142 moves, and the distance may be calculated by comparing a first signal Sig L with a second signal Sig R. As a result, as shown in FIG. 6B, when a first signal Sig L and a second signal Sig R output by the first photoelectric converter 144L and the second photoelectric converter 144R due to light beams L1 and L2 incident from an object 140 are identical, an AF image may be formed.

When a first signal Sig L and a second signal Sig R output by the first photoelectric converter 144L and the second photoelectric converter 144R due to light beams L1 and L2 incident from an object 140 are identical, as shown in FIG. 6B, no AF operation may be needed.

Figure 7:
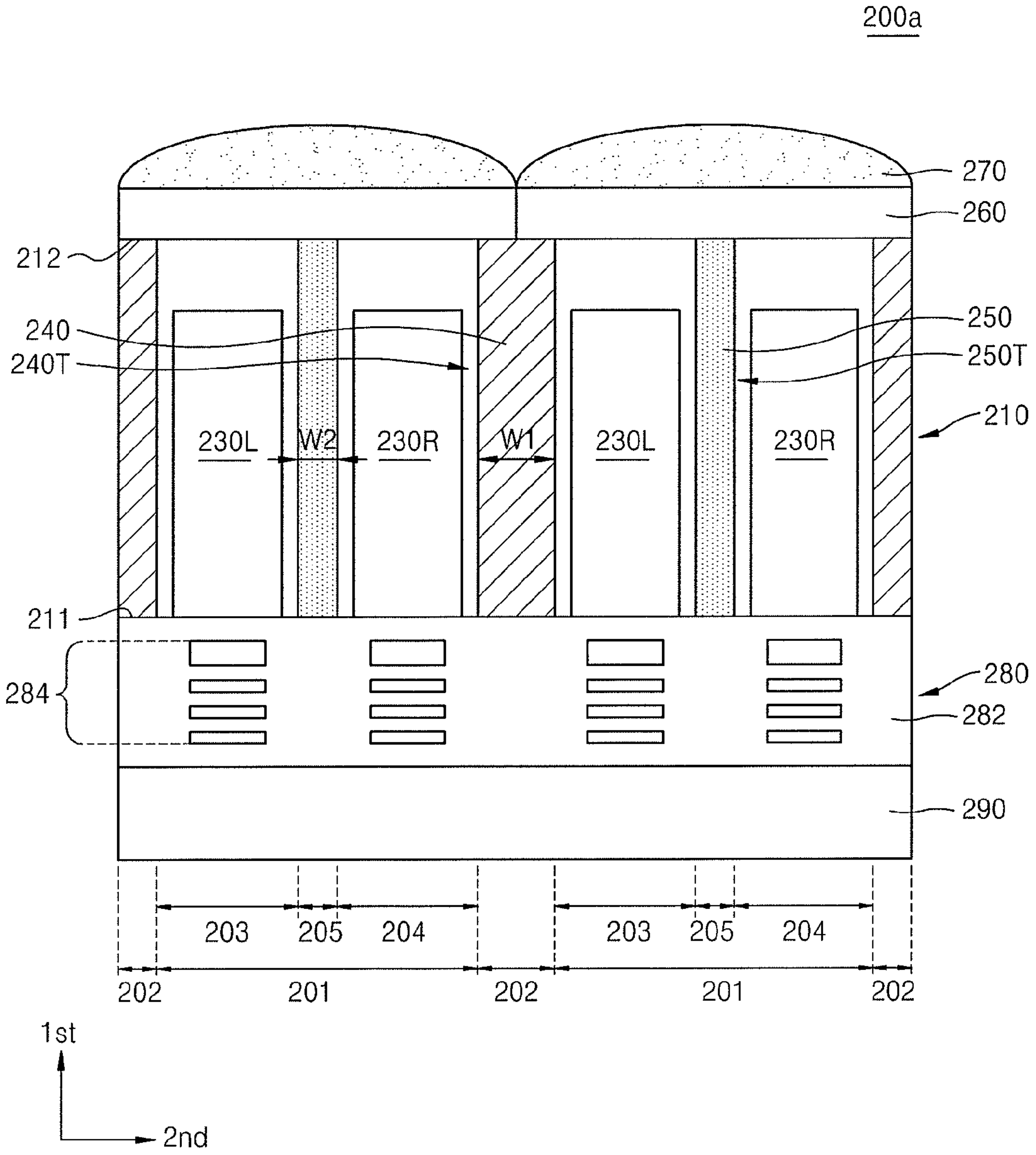
FIG. 7 illustrates a cross-sectional view of basic components of an image sensor according to an embodiment.
Figure 8:
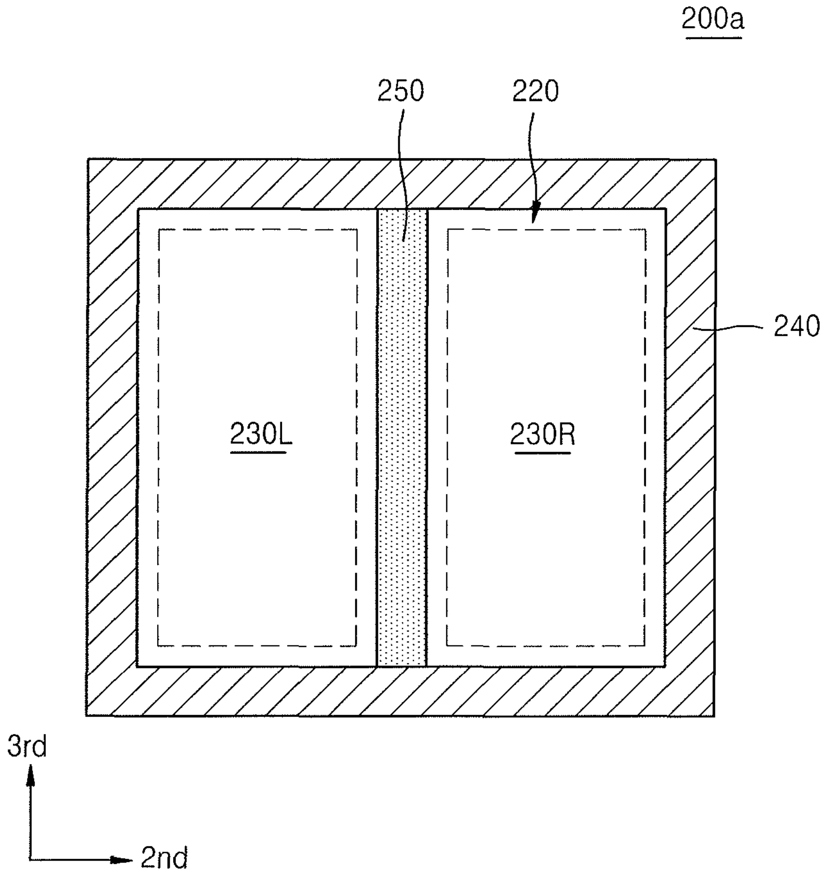
FIG. 8 illustrates a plan view of basic components of an image sensor according to an embodiment.

FIG. 7 is a cross-sectional view of basic components of an image sensor 200*a* according to an embodiment. FIG. 8 is a plan view of basic components of the image sensor 200*a* according to the embodiment.

Referring to FIG. 7, the image sensor 200*a* may include a semiconductor layer 210, a pixel isolation layer 240, a device isolation layer 250, a color filter layer 260, a ML layer 270, an interconnection layer 280, and a carrier substrate 290. The carrier substrate 290 may be a silicon substrate.

The semiconductor layer 210 may include a first surface 211 and a second surface 212 located opposite to the first surface 211. The semiconductor layer 210 may include a silicon substrate. The first surface 211 may be a front surface of the silicon substrate, and the second surface 212 may be a rear surface of the silicon substrate. The semiconductor layer 210 may be an epitaxial layer formed on the silicon substrate.

A plurality of unit pixels 220 may be arranged in the semiconductor layer 210. Each of the unit pixels 220 may include at least two photoelectric converters. For example, each of the unit pixels 220 may include a first photoelectric converter 230L and a second photoelectric converter 230R. The first and second photoelectric converters 230L and 230R may generate photoelectrons in response to externally incident light. Each of the first and second photoelectric converters 230L and 230R may be embodied by a photodiode, a phototransistor, a photogate, a pinned photodiode, and so forth.

A pixel isolation layer 240 may be between adjacent unit pixels 220 to isolate the unit pixels 220 from one another. The pixel isolation layer 240 may be formed by filling a pixel isolation trench 240T formed in the semiconductor layer 210 with an insulating material layer. The pixel isolation layer 240 may be the insulating material layer (e.g., an oxide) filling the pixel isolation trench 240T. The pixel isolation layer 240 may include a material having a lower refractive index than a material included in the semiconductor layer 210.

The pixel isolation trench 240T may be formed from the second surface 212 toward the first surface 211 or formed from the first surface 211 toward the second surface 212. The pixel isolation trench 240T may vertically extend, e.g., along a first direction, between the second surface 212 and the first surface 211.

As shown in FIG. 7, the pixel isolation trench 240T may be a through isolation trench that vertically penetrates the semiconductor layer 210 between the second surface 212 and the first surface 211, and the pixel isolation layer 240 may be the insulating material layer filling the through isolation trench. Alternatively, the pixel isolation trench 240T may be a partial isolation trench, which may be formed from the second surface 212 toward the first surface 211 along the first direction and spaced a predetermined distance apart from the first surface 211. Alternatively, the pixel isolation trench 240T may be a partial isolation trench, which may be formed from the first surface 211 toward the second surface 212 along the first direction and spaced a predetermined distance apart from the second surface 212 along the first direction. In other words, the pixel isolation layer 240 that extends between the second surface 212 and the first surface 211 to isolate the unit pixels 220 may be coplanar with one or both of the second surface 212 and the first surface 211.

Since the pixel isolation trench 240T is formed to a great depth between the first surface 211 and the second surface 212, the pixel isolation trench 240T may be referred to as a deep trench. By forming the pixel isolation layer 240 as a deep trench type, optical crosstalk and electrical crosstalk may be reduced. Optical crosstalk refers to a phenomenon where incident light traveling through the color filter layer 260 is transmitted to an adjacent photoelectric converter, while the electrical crosstalk refers to a phenomenon where electron-hole pairs generated in a depletion region are transmitted to an adjacent photoelectric converter.

The device isolation layer 250 may be formed by filling a device isolation trench 250T formed in the semiconductor layer 210 with an insulating material layer. The device isolation layer 250 may be the insulating material layer (e.g., an oxide) filling the device isolation trench 250T. The device isolation layer 250 may include a material having a lower refractive index than a material included in the semiconductor layer 210.

The device isolation trench 250T may extend from the second surface 212 toward the first surface 211 or extend from the first surface 211 toward the second surface 212. The device isolation trench 250T may vertically extend, e.g., along the first direction, between the second surface 212 and the first surface 211.

The device isolation trench 250T may be a deep trench, which is formed to a great depth between the first surface 211 and the second surface 212. The device isolation layer 250 may be formed as a deep trench type and improve a degree of isolation between the first photoelectric converter 230L and the second photoelectric converter 230R.

As shown in FIG. 7, the device isolation trench 250T may be a through isolation trench, which may vertically penetrate the semiconductor layer 210 between the second surface 212 and the first surface 211, and the device isolation layer 250 may be an insulating material layer filling the through isolation trench. Alternatively, the device isolation trench 250T may be a partial isolation trench, which may be formed from the second surface 212 toward the first surface 211 along the first direction and spaced a predetermined distance apart from the first surface 211 along the first direction. Alternatively, the device isolation trench 250T may be a partial isolation trench, which may be formed from the first surface 211 toward the second surface 212 along the first direction and spaced a predetermined distance apart from the second surface 212 along the first direction. In other words, the device isolation layer 250 that extends between the second surface 212 and the first surface 211 to isolate the photoelectric converters 230L, 230R may be coplanar with one or both of the second surface 212 and the first surface 211.

In some embodiments, the pixel isolation layer 240 may have a different width from the device isolation layer 250. For example, the pixel isolation layer 240 and the device isolation layer 250 may have a first width W1 and a second width W2, respectively, e.g., along the second direction. As shown in FIG. 7, the first width W1 of the pixel isolation layer 240 may be greater than the second width W2 of the device isolation layer 250. Alternatively, the first width W1 of the pixel isolation layer 240 may be less than the second width W2 of the device isolation layer 250.

An interconnection layer 280 may be formed on the first surface 211 of the semiconductor layer 210. The interconnection layer 280 may include an inter-metal dielectric (IMD) 282 and a multilayered metal interconnection 284. The IMD 282 may include an oxide layer or a composite layer of an oxide layer and a nitride layer. The oxide layer may be a silicon oxide layer. The multilayered metal interconnection 284 may be an electrical interconnection required for a sensing operation of the first and second photoelectric converters 230L and 230R formed in the semiconductor layer 210 or the above-described transistors. Also, the multilayered metal interconnection 284 may be used to reflect incident light traveling through the first and second photoelectric converters 230L and 230R toward the first and second converters 230L and 230R. The multilayered metal interconnection 284 may include copper, titanium, or titanium nitride.

A color filter layer 260 and an ML layer 270 may be formed on the second surface 212 of the semiconductor layer 210. The color filter layer 260 may transmit light having visible wavelengths. For example, the color filter layer 260 may be a red filter, a green filter, or a blue filter in each unit pixel 220. The red filter may transmit light having red wavelengths from among the light having visible wavelengths. The green filter may transmit light having green wavelengths from among the light having visible wavelengths. The blue filter may transmit light having blue wavelengths from among the light having visible wavelengths.

In some embodiments, the color filter layer 260 may be a cyan filter, a magenta filter, or a yellow filter. The cyan filter may transmit light having a wavelength range of about 450 nm to about 550 nm from among the light having visible wavelengths. The magenta filter may transmit light having a wavelength range of about 510 nm to about 480 nm from among light having visible wavelengths. The yellow filter may transmit light having a wavelength of about 500 nm to about 600 nm from among the light having visible wavelengths. The ML layer 270 may condense, e.g., focus, externally incident light. However, in some embodiments, the image sensor 200*a* may exclude the ML layer 270.

The unit pixels of the image sensor 200*a* may be divided from one another by a pixel isolation region 202. Also, the first photoelectric converter 230L and the second photoelectric converter 230R included in each of the unit pixels 220 may be divided from one another by a device isolation region 205. That is, the unit pixel 220 may be located in a unit pixel region 201 defined by the pixel isolation region 202. The first photoelectric converter 230L and the second photoelectric converter 230R may be respectively located in a first region 203 and a second region 204, which are divided from each other by the device isolation region 205 in the unit pixel region 201.

Meanwhile, the device isolation layer 250 may be in contact with the pixel isolation layer 240, as shown in FIG. 8. That is, one end of the device isolation layer 250 may be in contact with a first edge of the pixel isolation layer 240, and another end of the device isolation layer 250 may be in contact with a second edge of the pixel isolation layer 240, which is opposite to the first edge. Thus, as may be seen in FIG. 8, in a plan view, the device isolation layer 250 and the pixel isolation layer 240 may have different shapes. For example, as illustrated in FIG. 8, the pixel isolation layer 240 may be a rectangular ring and the device isolation layer 250 may be a rectangle. Also, as may be seen in FIG. 8, in a plane parallel to the first and second surfaces, the pixel isolation layer 240 may extend along three sides of the first and second photoelectric converters 230L and 230R, with the device isolation layer 250 extending along a fourth side thereof.

Alternatively, the device isolation layer 250 may be spaced a predetermined distance apart from the pixel isolation layer 240 at one or more edges along the third direction. That is, one end of the device isolation layer 250 may be spaced apart from the first edge of the pixel isolation layer 240 along the third direction and/or another end of the device isolation layer 250 may be spaced apart from the second edge of the pixel isolation layer 240, which is opposite to the first edge, along the third direction.

Figure 9:
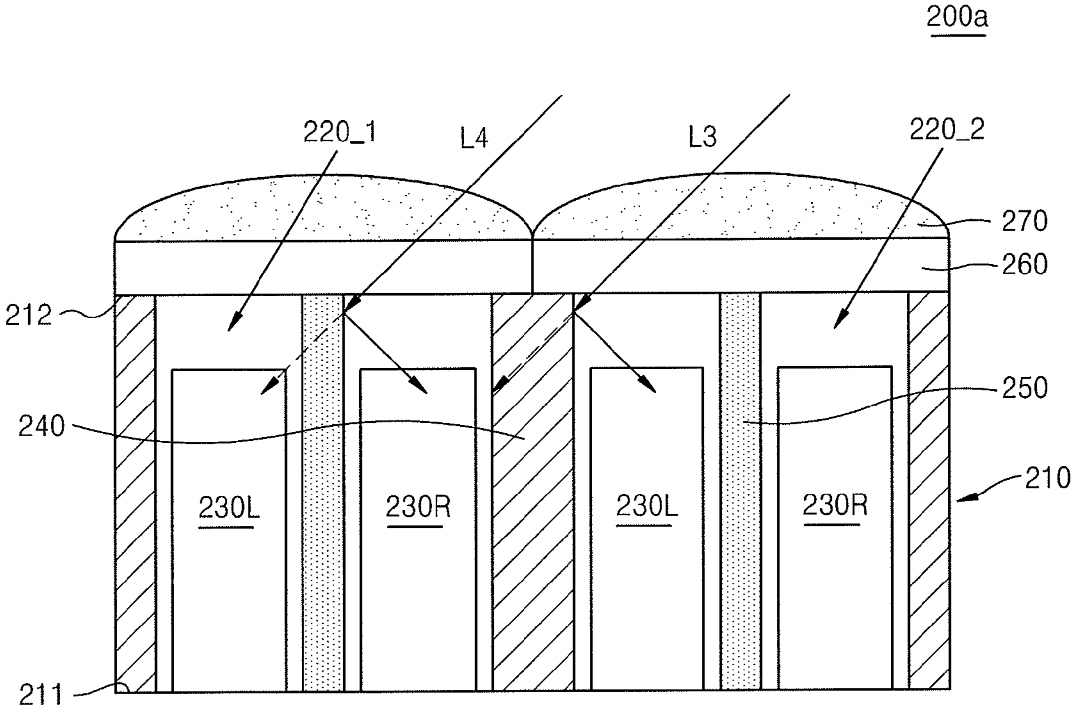
FIG. 9 illustrates a cross-sectional view of basic components of an image sensor according to an embodiment.

FIG. 9 is a cross-sectional view of basic components of an image sensor 200*a* according to an embodiment. Referring to FIG. 9, as described above, the image sensor 200*a* may include a plurality of unit pixels 220. Each of the unit pixels 220 may include at least two photoelectric converters (e.g., first and second photoelectric converters 230L and 230R).

When two adjacent unit pixels 220 are referred to as a first unit pixel 220_1 and a second unit pixel 220_2, the first unit pixel 220_1 and the second unit pixel 220_2 may be isolated from each other by a pixel isolation layer 240 provided therebetween. As shown in FIG. 9, light L3 incident to the second unit pixel 220_2 from the right side of the pixel isolation layer 240 provided between the first unit pixel 220_1 and the second unit pixel 220_2 may not travel to the first unit pixel 220_1 due to the pixel isolation layer 240.

Furthermore, the first photoelectric converter 230L and the second photoelectric converter 230R may be isolated from each other by a device isolation layer 250 provided therebetween. As shown in FIG. 9, light L4 incident to the second photoelectric converter 230R from the right side of the device isolation layer 250 provided between the first photoelectric converter 230L and the second photoelectric converter 230R may not travel to the first photoelectric converter 230L due to the device isolation layer 250.

Although optical crosstalk has mainly been described with reference to FIG. 9, a pixel isolation region 202 including the pixel isolation layer 240 may also improve electrical crosstalk between the unit pixels 220. Also, a device isolation region 205 including the device isolation layer 250 may improve electrical crosstalk between the first and second photoelectric converters 230L and 230R included in each of the unit pixels 220.

Figure 10:
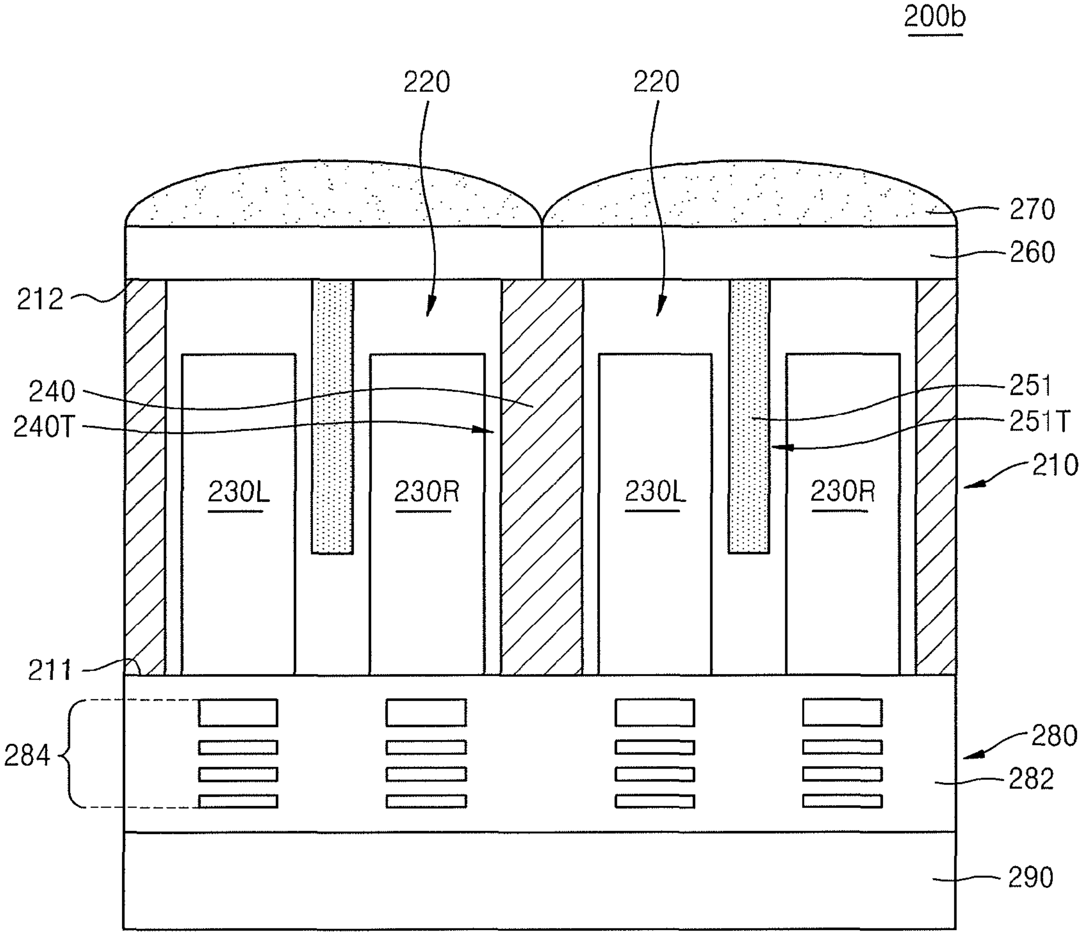
FIG. 10 illustrates a cross-sectional view of basic components of an image sensor according to an embodiment.

FIG. 10 is a cross-sectional view of basic components of an image sensor 200*b* according to an embodiment. Referring to FIG. 10, the image sensor 200*b* may have substantially the same structure as the image sensor 200*a* except for a device isolation layer 251 and a device isolation trench 251T. The same descriptions as in FIG. 7 will be omitted or simplified for brevity.

In some embodiments, a pixel isolation layer 240 may be in contact with a first surface 211 and a second surface 212 of a semiconductor layer 210, while the device isolation layer 251 may extend from the second surface 212 toward the first surface 211 and be spaced a predetermined distance apart from the first surface 211. That is, the pixel isolation layer 240 may be formed by filling a through isolation trench, which vertically penetrates the semiconductor layer 210 between the second surface 212 and the first surface 211, with an insulating material layer. Also, the device isolation layer 251 may be formed by filling a partial isolation trench, which is formed from the second surface 212 toward the first surface 211 and spaced apart from the first surface 211 along the first direction, with an insulating material layer.

Alternatively, the device isolation layer 251 may be formed to fill a through isolation trench, which may vertically penetrate the first surface 211 and the second surface 212, e.g., may be the same as layer 250 of FIG. 7, while the pixel isolation layer 240 may be formed to fill a partial isolation trench, which may extend from the second surface 212 toward the first surface 211 and be formed a predetermined distance apart from the first surface 211 along the first direction.

Figure 11:
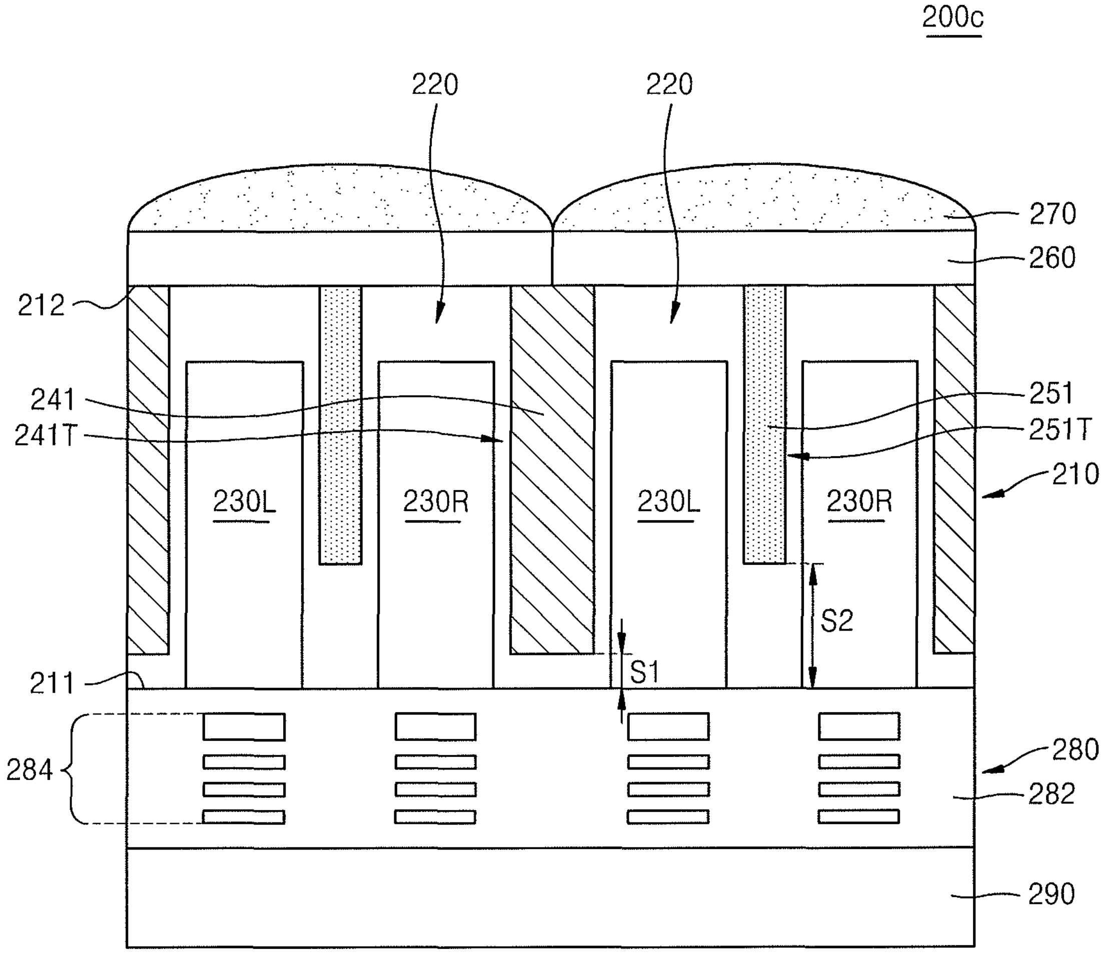
FIG. 11 illustrates a cross-sectional view of basic components of an image sensor according to an embodiment.

FIG. 11 is a cross-sectional view of basic components of an image sensor 200*c* according to an embodiment. Referring to FIG. 11, the image sensor 200*c* may have substantially the same structure as the image sensor 200*a* except for a pixel isolation layer 241, a pixel isolation trench 241T, a device isolation layer 251, and a device isolation trench 251T. The same descriptions as in FIG. 7 will be omitted or simplified for brevity.

The pixel isolation trench 241T may be a partial isolation trench, which may be formed from a second surface 212 toward a first surface 211 of a semiconductor layer 210 and apart a distance S1 apart from the first surface 211. That is, the pixel isolation layer 241 formed in the pixel isolation trench 241T may be spaced the distance S1 apart from the first surface 211.

The device isolation trench 251T may be a partial isolation trench, which may be formed from the second surface 212 toward the first surface 211 of the semiconductor layer 210 and apart a distance S2 apart from the first surface 211. That is, the device isolation layer 251 formed in the device isolation trench 251T may be spaced the distance S2 apart from the first surface 211.

Meanwhile, the pixel isolation layer 241 and the device isolation layer 251 may extend to different depths from the second surface 212, e.g., along the first direction. As shown in FIG. 11, the distance S2 between the device isolation layer 251 and the first surface 211 along the first direction may be greater than the distance S1 between the pixel isolation layer 241 and the first surface 211 along the first direction. Alternatively, the device isolation layer 251 may be closer to the first surface 211 than the pixel isolation layer 241.

Figure 12:
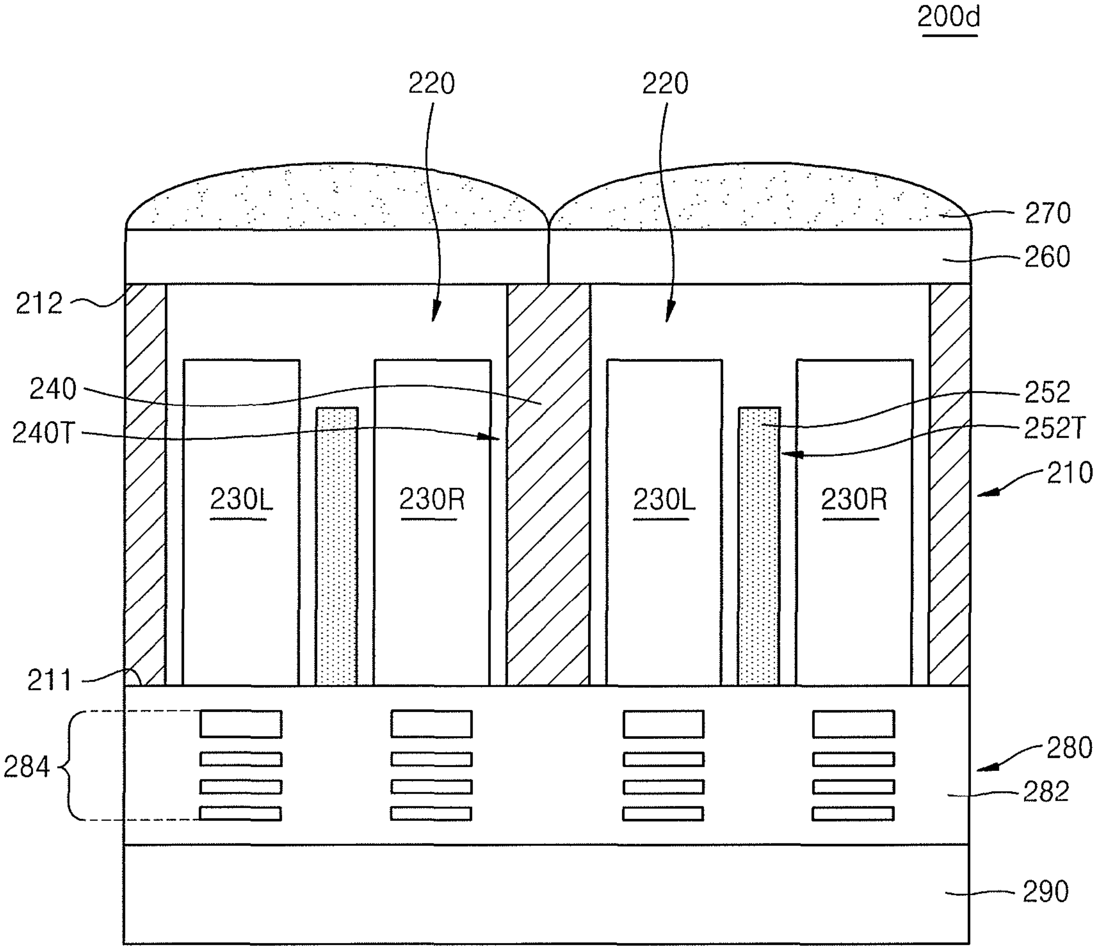
FIG. 12 illustrates a cross-sectional view of basic components of an image sensor according to an embodiment.

FIG. 12 is a cross-sectional view of basic components of an image sensor 200*d* according to an embodiment. Referring to FIG. 12, the image sensor 200*d* may have substantially the same structure as the image sensor 200*a* of FIG. 7 except for a device isolation layer 252 and a device isolation trench 252T. The same descriptions as in FIG. 7 will be omitted or simplified for brevity.

In some embodiments, a pixel isolation layer 240 may be in contact with a first surface 211 and a second surface 212 of a semiconductor layer 210, while a device isolation layer 252 may extend from the first surface 211 toward the second surface 212 and be spaced a predetermined distance apart from the second surface 212. That is, the pixel isolation layer 240 may be formed by filling a through isolation trench, which vertically penetrates the semiconductor layer 210 between the second surface 212 and the first surface 211, with an insulating material layer. The device isolation layer 252 may be formed by filling a partial isolation trench, which is formed from the first surface 211 toward the second surface 212 and spaced apart from the second surface 212, with an insulating material layer.

Alternatively, the device isolation layer 252 may be formed to fill a through isolation trench, which may vertically penetrate the first surface 211 and the second surface 212, and the pixel isolation layer 240 may be formed to fill a partial isolation trench, which may extend from the first surface 211 toward the second surface 212 along the first direction and be a predetermined distance apart from the second surface 212 along the first direction.

Figure 13:
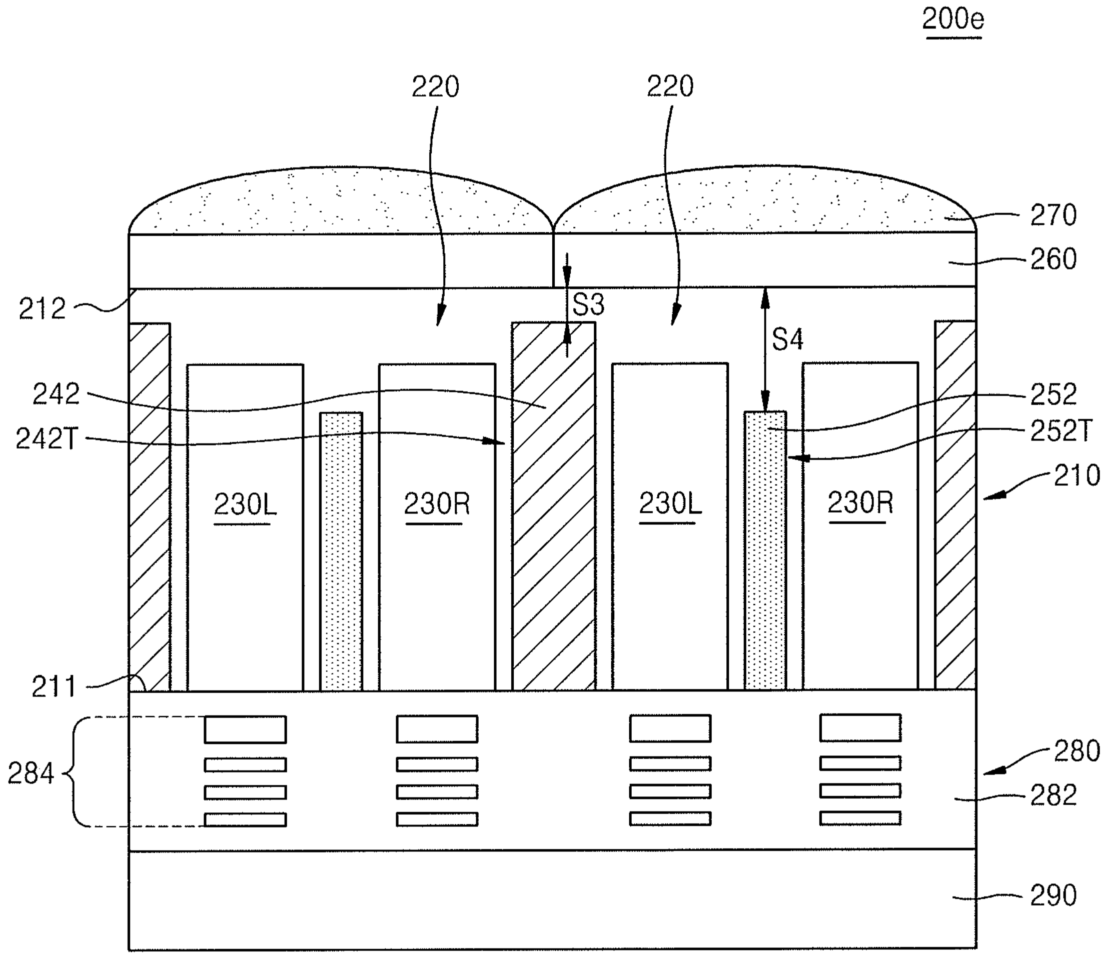
FIG. 13 illustrates a cross-sectional view of basic components of an image sensor according to an embodiment.

FIG. 13 is a cross-sectional view of basic components of an image sensor 200*e* according to an embodiment. Referring to FIG. 13, the image sensor 200*e* may have substantially the same structure as the image sensor 200*a* of FIG. 7 except for a pixel isolation layer 242, a pixel isolation trench 242T, a device isolation layer 252, and a device isolation trench 252T. The same descriptions as in FIG. 7 will be omitted or simplified for brevity.

The pixel isolation trench 242T may be a partial isolation trench, which may be formed from a first surface 211 toward a second surface 212 of a semiconductor layer 210 and spaced a distance S3 apart from the second surface 212. That is, the pixel isolation layer 242 formed in the pixel isolation trench 242T may be spaced a distance S3 apart from the second surface 212.

The device isolation trench 252T may be a partial isolation trench, which may be formed from the first surface 211 toward the second surface 212 of the semiconductor layer 210 and spaced a distance S4 apart from the second surface 212. That is, the device isolation layer 252 formed in the device isolation trench 252T may be spaced the distance S4 apart from the second surface 212.

The pixel isolation layer 242 and the device isolation layer 252 may extend to different depths from the first surface 211 along the first direction. As shown in FIG. 13, the distance S4 between the device isolation layer 252 and the second surface 212 may be greater than the distance S3 between the pixel isolation layer 242 and the first surface 211 along the first direction. Alternatively, the device isolation layer 252 may be closer to the second surface 212 than the pixel isolation layer 242 along the first direction.

Figure 14:
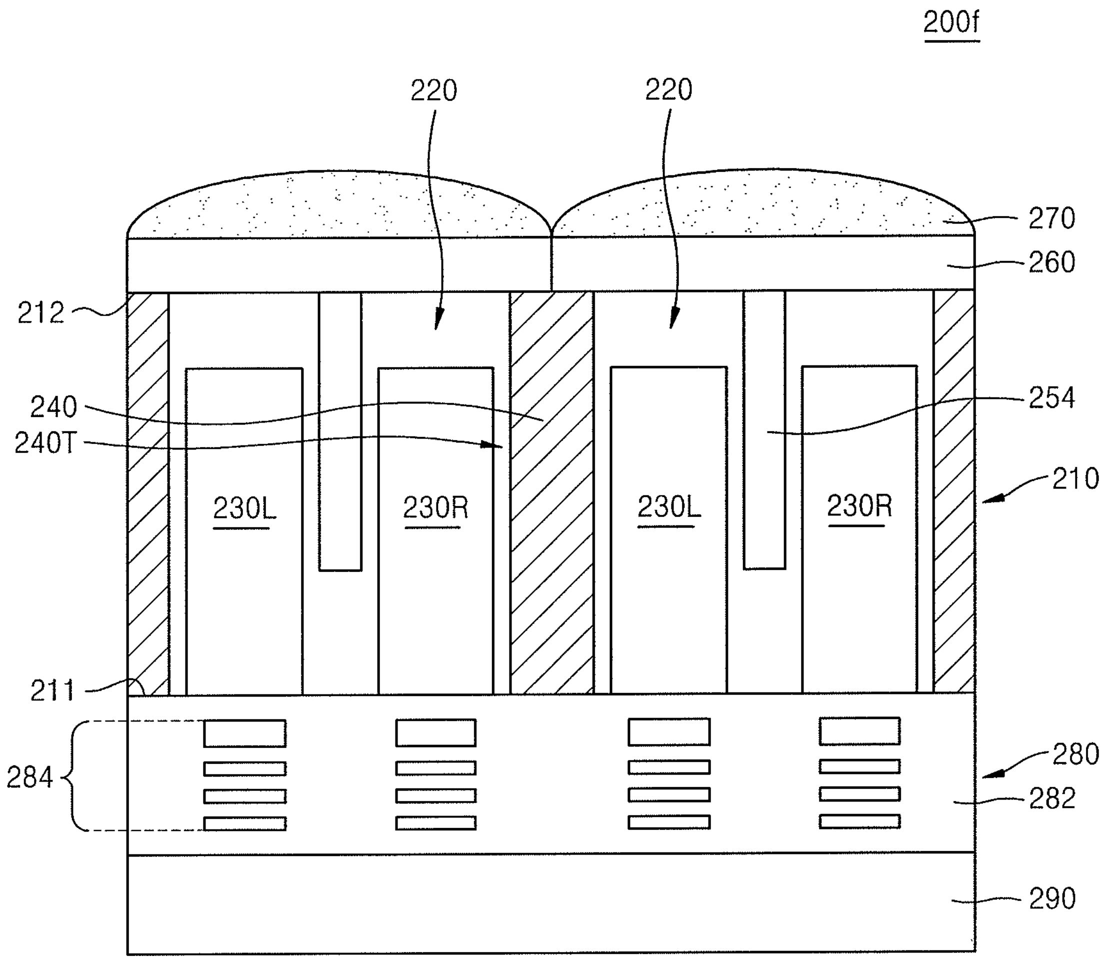
FIG. 14 illustrates a cross-sectional view of basic components of an image sensor according to an embodiment.

FIG. 14 is a cross-sectional view of basic components of an image sensor 200*f* according to an embodiment. Referring to FIG. 14, the image sensor 200*f* may have substantially the same structure as the image sensor 200*a* of FIG. 7 except that a device isolation region is formed due to an ion implantation layer 254 instead of the device isolation layer 250 of FIG. 7. The same descriptions as in FIG. 7 will be omitted or simplified for brevity.

A first photoelectric converter 230L and a second photoelectric converter 230R included in a unit pixel 220 may be isolated from each other by an ion implantation layer 254 formed therebetween. The ion implantation layer 254 may include a material of a different conductivity type from the first and second photoelectric converters 230L and 230R. For example, the first and second photoelectric converters 230L and 230R may be formed by using an N-type doping process, and the ion implantation layer 254 may be formed by using a P-type doping process.

Figure 15:
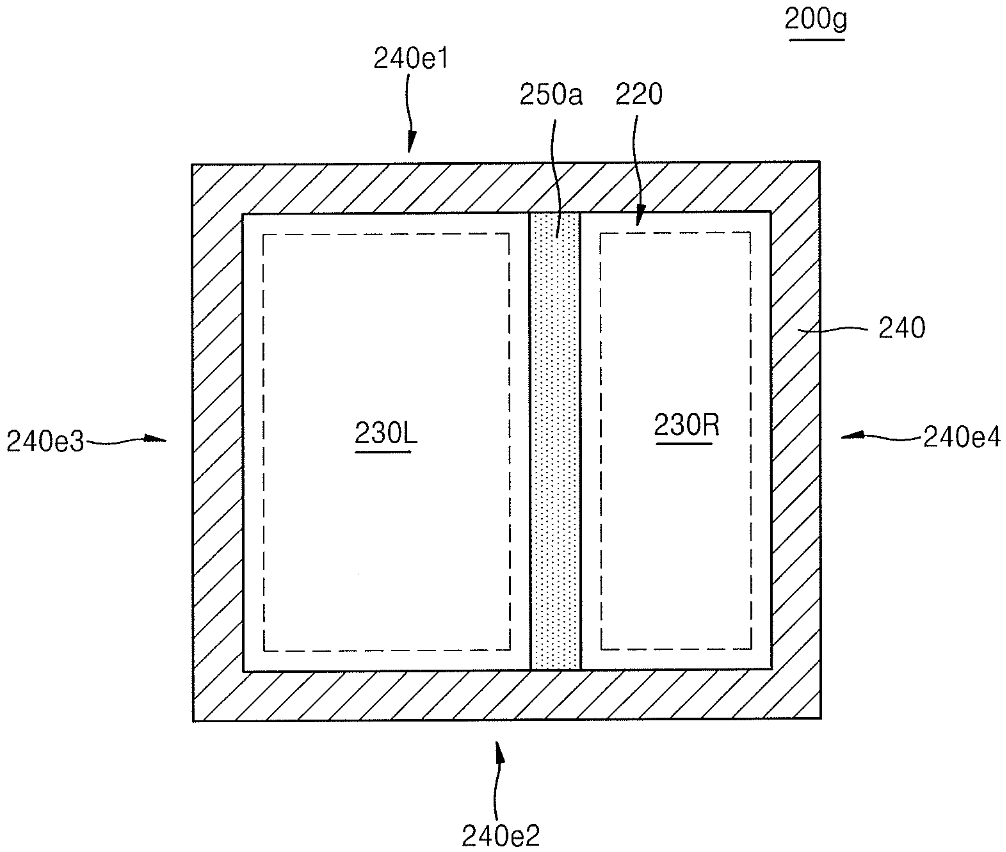
FIG. 15 illustrates a plan view of basic components of an image sensor according to an embodiment.

FIG. 15 is a plan view of basic components of an image sensor 200*g* according to an embodiment. Referring to FIG. 15, the image sensor 200*g* may have substantially the same structure as the image sensor 200*a* except for a position of a device isolation layer 250*a*. The same descriptions as in FIG. 8 will be omitted or simplified for brevity.

A pixel isolation layer 240 surrounding a unit pixel 220 may have two pairs of edges, which are located opposite to each other. The device isolation layer 250*a* may be in contact with a first edge 240*e*1 and a second edge 240*e*2 of the pixel isolation layer 240, which are opposite to each other. The device isolation layer 250*a* may face a third edge 240*e*3 and a fourth edge 240*e*4 of the pixel isolation layer 240 between the third and fourth edges 240*e*3 and 240*e*4, which may be opposite to each other.

In this case, the device isolation layer 250*a* may be formed in the unit pixel 220 defined by the pixel isolation layer 240 and located a predetermined distance apart from the center of the unit pixel 220 toward an edge thereof along the third direction. That is, a distance between the device isolation layer 250*a* and the third edge 240*e*3 may be greater than a distance between the device isolation layer 250*a* and the fourth edge 240*e*4. Thus, an area of a first region in which the first photoelectric converter 230L is formed may be different from an area of a second region in which the second photoelectric converter 230R is formed.

Figure 16:
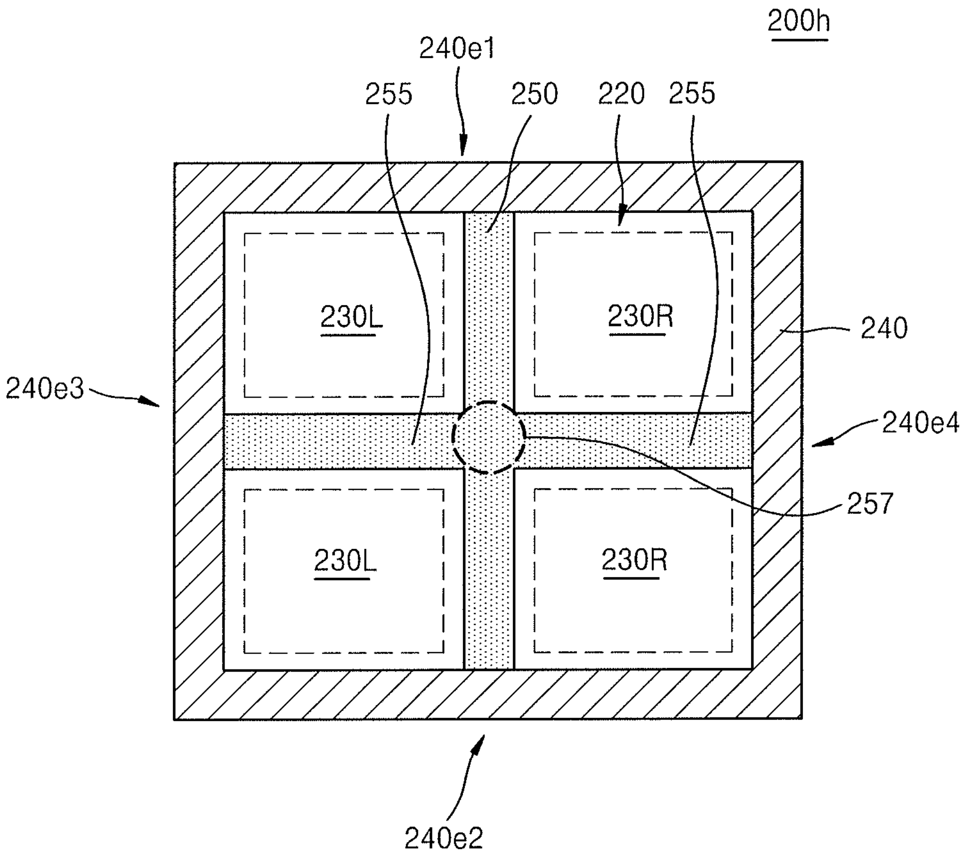
FIG. 16 illustrates a plan view of basic components of an image sensor according to an embodiment.

FIG. 16 is a plan view of basic components of an image sensor 200*h* according to an embodiment. Referring to FIG. 16, the image sensor 200*h* may substantially the same structure as in FIG. 8 except that the image sensor 200*h* includes a first device isolation layer 250 and a second device isolation layer 255. The same descriptions as in FIG. 8 will be omitted or simplified for brevity.

Specifically, a unit pixel 220 may include a first device isolation layer 250 configured to isolate a first photoelectric converter 230L and a second photoelectric converter 230R from each other and a second device isolation layer 255 provided in each of the first photoelectric converter 230L and the second photoelectric converter 230R.

For example, the second device isolation layer 255 may be formed by filling a partial isolation trench, which may be formed from the second surface (refer to 212 in FIG. 7) toward the first surface (refer to 211 in FIG. 7) and spaced apart from the first surface 211, with an insulating material layer.

The first device isolation layer 250 may intersect the second device isolation layer 255, e.g., to from a cross. An interconnection region 257 at which the first device isolation layer 250 intersects the second device isolation layer 255 may be located in the center of the unit pixel 220.

For example, a pixel isolation layer 240 surrounding the unit pixel 220 may have two pairs of edges located opposite to each other. A first edge 240*e*1 and a second edge 240*e*2 of the pixel isolation layer 240, which are opposite to each other, may be in contact with the first device isolation layer 250. A third edge 240*e*3 and a fourth edge 240*e*4 of the pixel isolation layer 240, which are opposite to each other, may be in contact with a second device isolation layer 255.

In some embodiments, a distance from the interconnection region 257 to the third edge 240*e*3 may be substantially equal to a distance from the interconnection region 257 to the fourth edge 240*e*4. Thus, an area of a first region in which the first photoelectric converter 230L is formed may be substantially equal to an area of a second region in which the second photoelectric converter 230R is formed.

Furthermore, in some embodiments, a distance from the interconnection region 257 to the first edge 240*e*1 may be substantially equal to a distance from the interconnection region 257 to the second edge 240*e*2. Thus, two regions of the first photoelectric converter 230L, which are isolated from each other by the second device isolation layer 255, may have substantially the same area. Also, two regions of the second photoelectric converter 230R, which are isolated from each other by the second device isolation layer 255, may have substantially the same area. Alternatively, the first device isolation layer 250 and the second device isolation layer 255 may be formed a predetermined distance apart from the pixel isolation layer 240.

Figure 17:
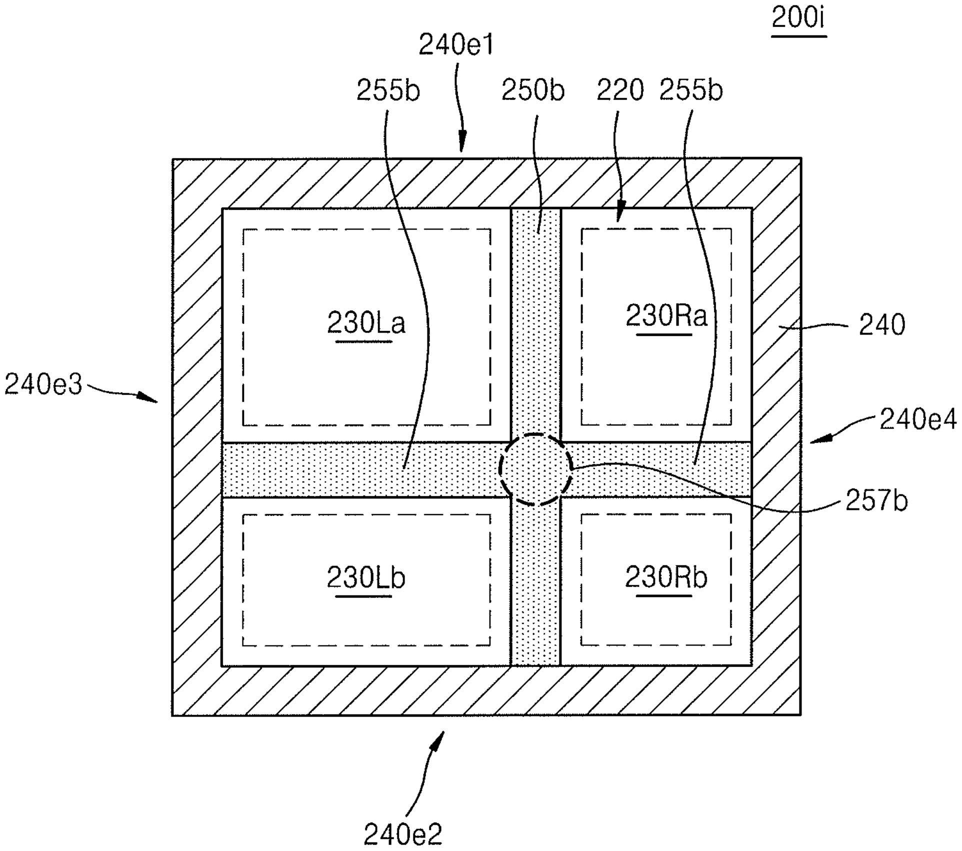
FIG. 17 illustrates a plan view of basic components of an image sensor according to an embodiment.

FIG. 17 is a plan view of basic components of an image sensor 200*i* according to an embodiment. Referring to FIG. 17, the image sensor 200*i* may have substantially the same structure as the image sensor 200*h* except for a first device isolation layer 250 and a second device isolation layer 255. The same descriptions as in FIG. 16 will be omitted or simplified for brevity.

Specifically, the first device isolation layer 250*b* may intersect the second device isolation layer 255*b*, and an interconnection region 257*b* at which the first device isolation layer 250*b* intersects the second device isolation layer 255*b* may be spaced a predetermined distance apart from the center of the unit pixel 220 toward an edge of the unit pixel 220.

In some embodiments, a distance from the interconnection region 257*b* to a third edge 240*e*3 may be greater than a distance from the interconnection region 257*b* to a fourth edge 240*e*4 along the second direction. Thus, an area of a first region in which first photoelectric converters 230La and 230Lb are formed may be larger than an area of a second region in which second photoelectric converters 230Ra and 230Rb are formed.

Furthermore, in some embodiments, a distance from the interconnection region 257*b* to a first edge 240*e*1 may be greater than a distance from the interconnection region 257*b* to a second edge 240*e*2 along the third direction. Thus, the first photoelectric converters 230La and 230Lb, which are divided from each other by the second device isolation layer 255*b*, may have different areas, and second photoelectric converters 230Ra and 230Rb, which are divided from each other by the second device isolation layer 255*b*, may have different areas.

FIGS. 18 to 21 are cross-sectional views illustrating stages in a method of manufacturing an image sensor according to an embodiment.

Figure 18:
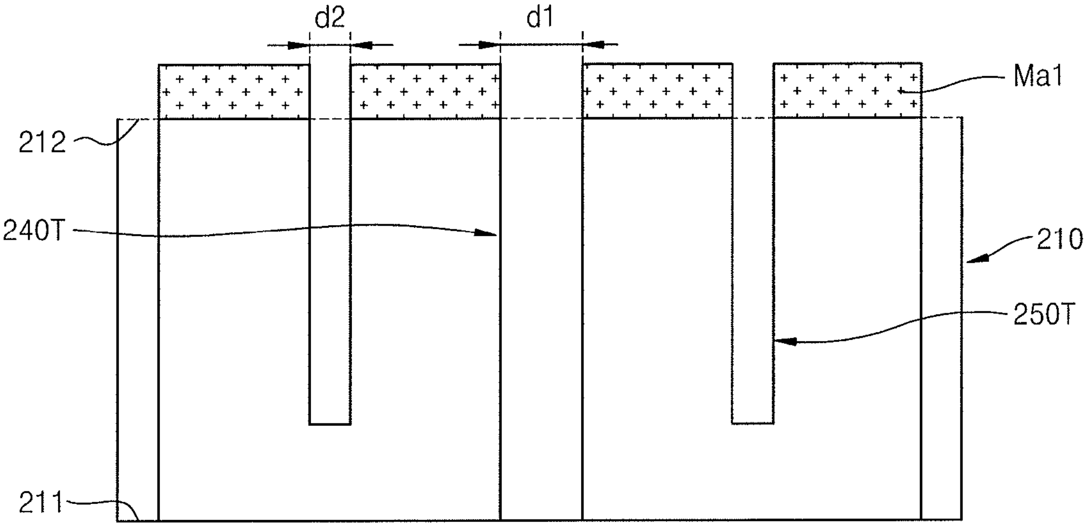
FIGS. 18 to 21 illustrate cross-sectional views of stages in a method of manufacturing an image sensor according to an embodiment.

Referring to FIG. 18, the semiconductor layer 210 including the first surface 211 and the second surface 212 may be prepared. The semiconductor layer 210 may include a silicon substrate. The first surface 211 may be a front surface of the silicon substrate, and the second surface 212 may be a rear surface of the silicon substrate. The second surface 212 of the semiconductor layer 210 may be the rear surface of the silicon substrate, which is not ground yet.

A first mask pattern Ma1 may be formed on the second surface 212 of the semiconductor layer 210. The semiconductor layer 210 may be etched from the second surface 212 toward the first surface 211 by using the first mask pattern Ma1 as an etch mask, thereby forming a pixel isolation trench 240T and a device isolation trench 250T. The pixel isolation trench 240T may be formed in a portion of the semiconductor layer 210 corresponding to a through region, which is formed in the first mask pattern Ma1 and has a width of d1. The device isolation trench 250T may be formed in a portion of the semiconductor layer 210 corresponding to a through region, which is formed in the first mask pattern Ma1 and has a width of d2. Here, d2 may be smaller than d1. Since the pixel isolation trench 240T is etched in a portion of the first mask pattern Ma1, which is exposed to a relatively great width (i.e., d1), the pixel isolation trench 240T may have a greater width and depth than the device isolation trench 250T, which is etched in a portion of the first mask pattern Ma1, which is exposed to a relatively small width (i.e., d2). For instance, the pixel isolation trench 240T may penetrate the semiconductor layer 210, while the device isolation trench 250T may extend from the second surface 212 toward the first surface 211 of the semiconductor layer 210 and be spaced apart a predetermined distance apart from the first surface 211.

Figure 19:
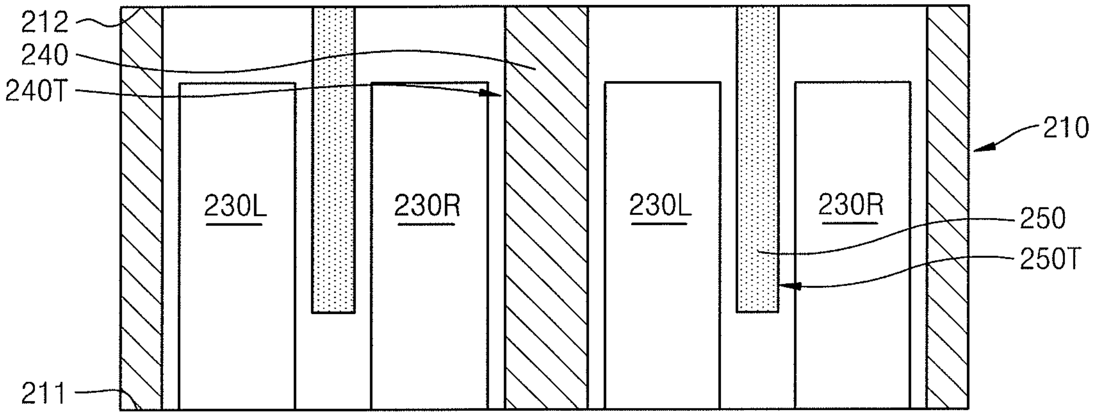

Referring to FIG. 19, the pixel isolation trench 240T and the device isolation trench 250T may be filled with an insulating material layer to form the pixel isolation layer 240 and the device isolation layer 250. Thereafter, the first photoelectric converter 230L and the second photoelectric converter 230R may be formed on the side of the first surface 211 of the semiconductor layer 210. Before or after the first and second photoelectric converters 230L and 230R are formed, the second surface 212 of the semiconductor layer 210 may be ground. Alternatively, after the pixel isolation layer 240 and the device isolation layer 250 are formed, the second surface 212 of the semiconductor layer 210 may be ground.

Figure 20:
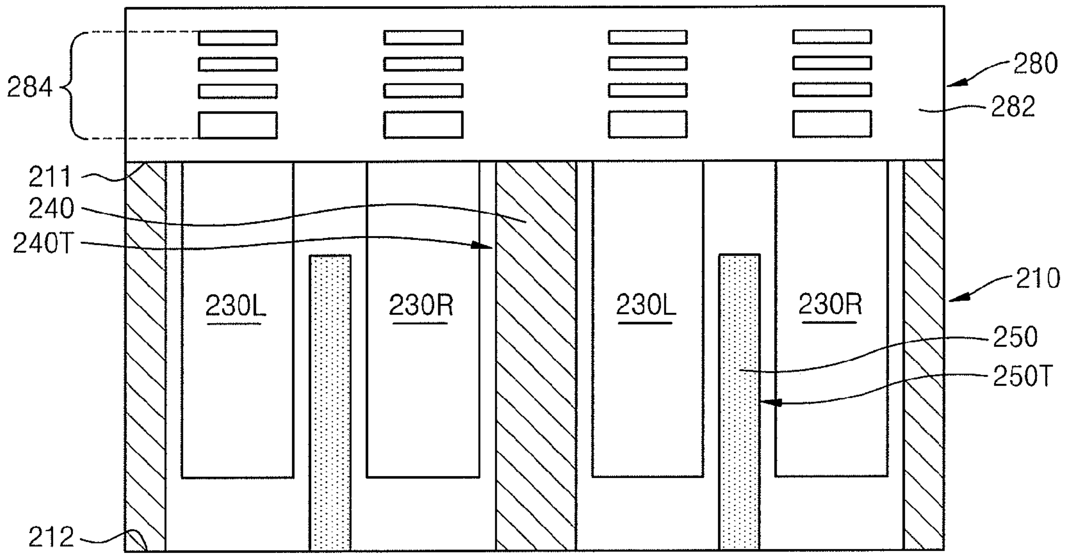

Referring to FIG. 20, an interconnection layer 280 may be formed on the first surface 211 of the semiconductor layer 210. As described above, the interconnection layer 280 may include an IMD 282 and a multilayered metal interconnection 284. The IMD 282 may include an oxide layer or a composite layer of an oxide layer and a nitride layer.

Figure 21:
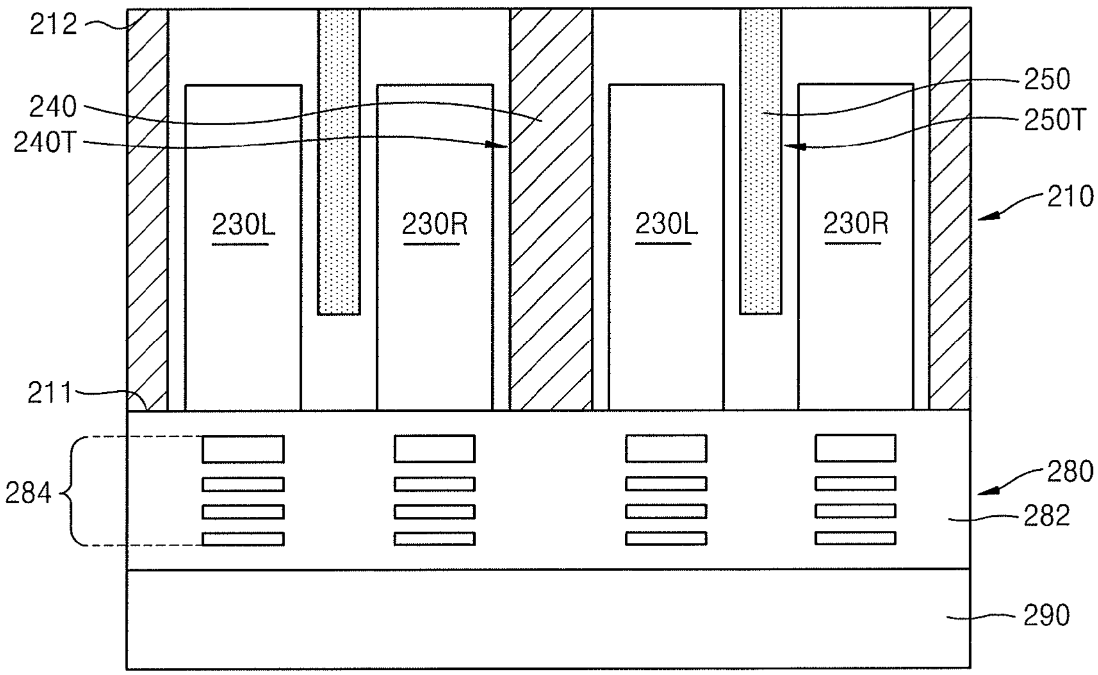

Referring to FIG. 21, a carrier substrate 290 may be prepared on the interconnection layer 280. Thereafter, as shown in FIG. 7, the color filter layer 260 and the ML layer 270 may be formed on the second surface 212.

Figure 22:
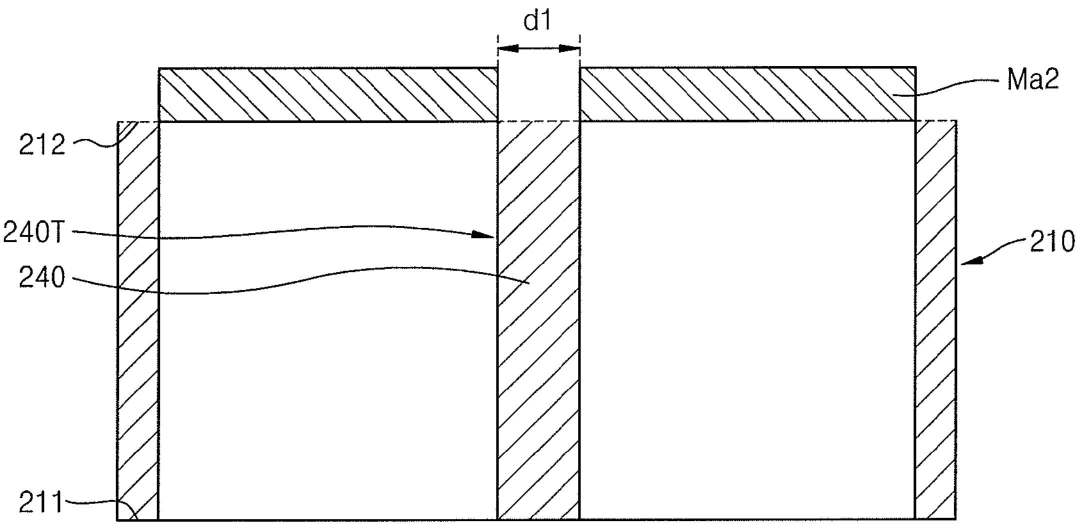
FIGS. 22 and 23 illustrate cross-sectional views of stages in a method of manufacturing an image sensor according to an embodiment.
Figure 23:
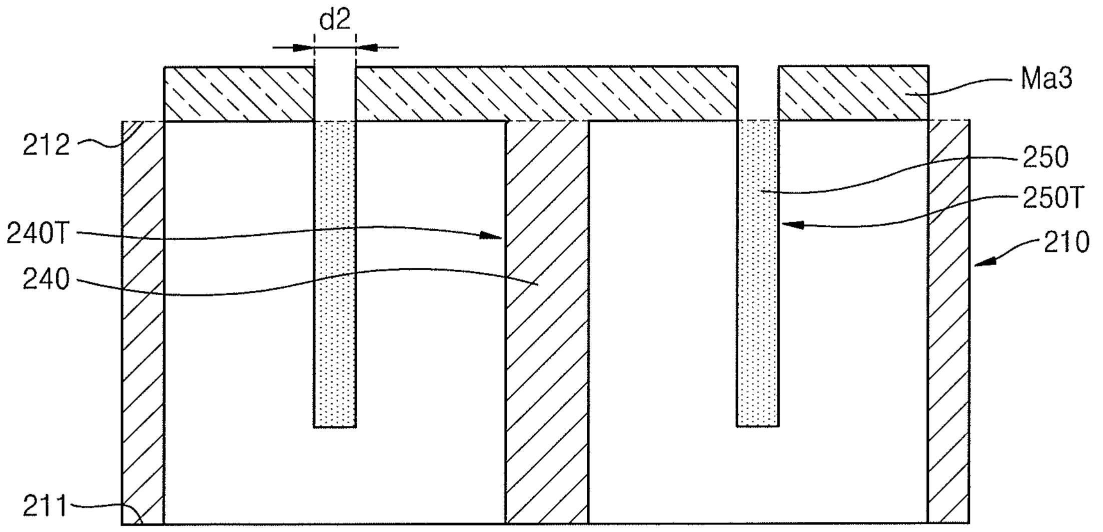

FIGS. 22 and 23 are cross-sectional views of basic components, illustrating a method of manufacturing an image sensor according to an embodiment.

Referring to FIG. 22, the semiconductor layer 210 including the first surface 211 and the second surface 212 may be prepared. The semiconductor layer 210 may be a silicon substrate. The first surface 211 may be a front surface of the silicon substrate, and the second surface 212 may be a rear surface of the silicon substrate. The second surface 212 of the semiconductor layer 210 may be the rear surface of the silicon substrate, which is not ground yet.

A second mask pattern Ma2 may be formed on the second surface 212 of the semiconductor layer 210. The semiconductor layer 210 may be etched from the second surface 212 toward the first surface 211 by using the second mask pattern Ma2 as an etch mask, thereby forming a pixel isolation trench 240T. The pixel isolation trench 240T may be formed in a portion of the semiconductor layer 210 corresponding to a through region, which is formed in the second mask pattern Ma2 and has a width of d1. The pixel isolation trench 240T may penetrate the semiconductor layer 210.

Thereafter, the pixel isolation trench 240T may be filled with an insulating material layer to form a pixel isolation layer 240. The second mask pattern Ma2 may be removed to perform subsequent processes.

Referring to FIG. 23, a third mask pattern Ma3 may be formed on the second surface 212 of the semiconductor layer 210. The semiconductor layer 210 may be etched by using the third mask pattern Ma3 as an etch mask from the second surface 212 toward the first surface 211 to form a device isolation trench 250T. The device isolation trench 250T may be formed in a portion of the semiconductor layer 210 corresponding to a through region that is formed in the third mask pattern Ma3 and has a width of d2. The device isolation trench 250T may be formed in the semiconductor layer 210 and have different depth and width from those of the pixel isolation trench 240T.

Thereafter, the device isolation trench 250T may be filled with an insulating material layer to form the device isolation layer 250. Subsequently, processes described with reference to FIGS. 19 to 21 may be performed to complete the manufacture of the image sensor.

Figure 24:
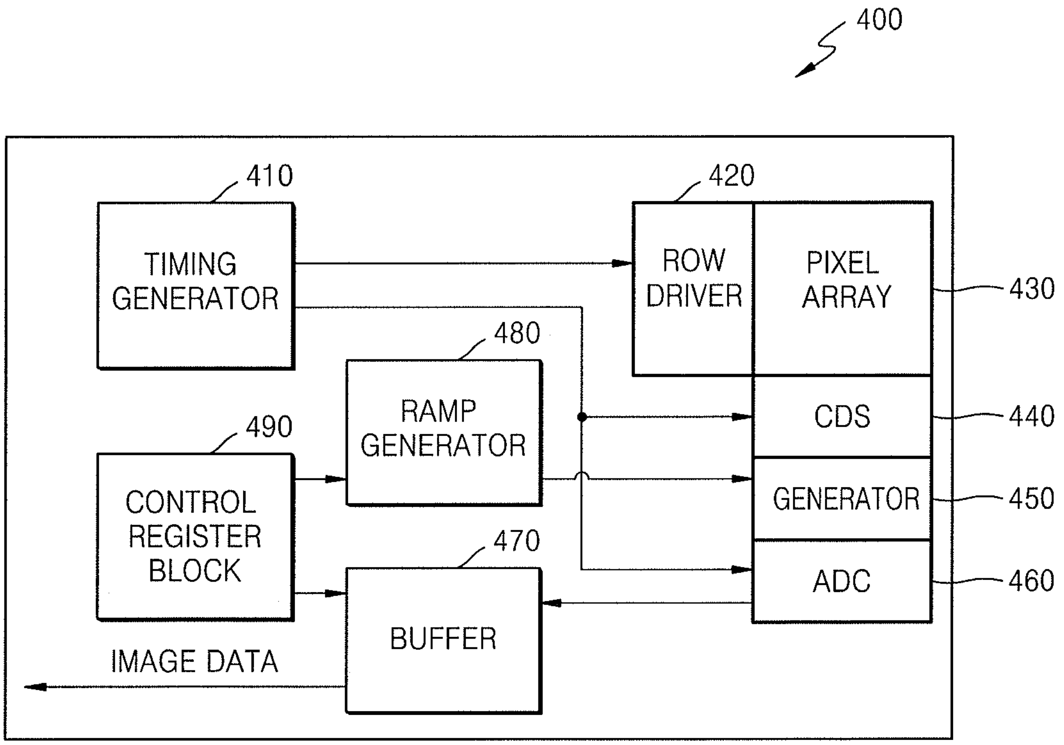
FIG. 24 illustrates a schematic block diagram of an image sensor chip including an image sensor according to an embodiment.

FIG. 24 is a schematic block diagram of an image sensor chip 510 including an image sensor according to an embodiment.

Specifically, the image sensor chip 510 may include a timing generator 410, a row driver 420, a pixel array 430, a CDS 440, a comparator 450, an ADC 460, a buffer 470, a ramp generator 480, and a control register block 490. Here, each of the row driver 420, the pixel array 430, the CDS 440, the comparator 450, and the ADC 460 may include one of the image sensors shown in FIGS. 1 to 5 and 7 to 17.

The row driver 420 may provide a signal for driving each of a plurality of pixels to the pixel array 430. The pixel array 430 may convert object information (i.e., optical data) captured by an optical lens into electrons and generate an electric image signal. The CDS 440 may eliminate noise from the electric image signal generated by the pixel array 430 and select a required signal. The comparator 450 may compare the selected signal with a predetermined value, and the ADC 460 may convert an output of the comparator 450 into digital data. The buffer 460 may buffer the digital data output by the ADC 460.

Figure 25:
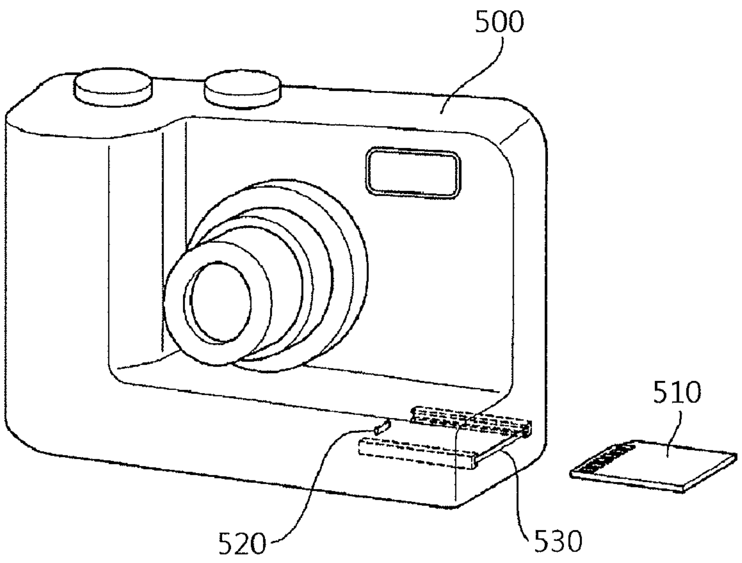
FIG. 25 illustrates a diagram of a camera device using the image sensor chip of FIG. 24.

FIG. 25 is a diagram of a camera device 500 using the image sensor chip of FIG. 24.

Specifically, the camera device 500 may include a digital signal processor (DSP) 5200 in which a camera controller and an image signal processor are embedded, and an insertion unit 530 in which an image sensor chip 510 may be mounted. Although the image sensor chip 510 is illustrated as capable of being attached to and detached from the camera device 500, the DSP 5200 and the image sensor chip 510 may be combined into a single module. The image sensor chip 510 may include the image sensor chip 510 shown in FIG. 24.

Figure 26:
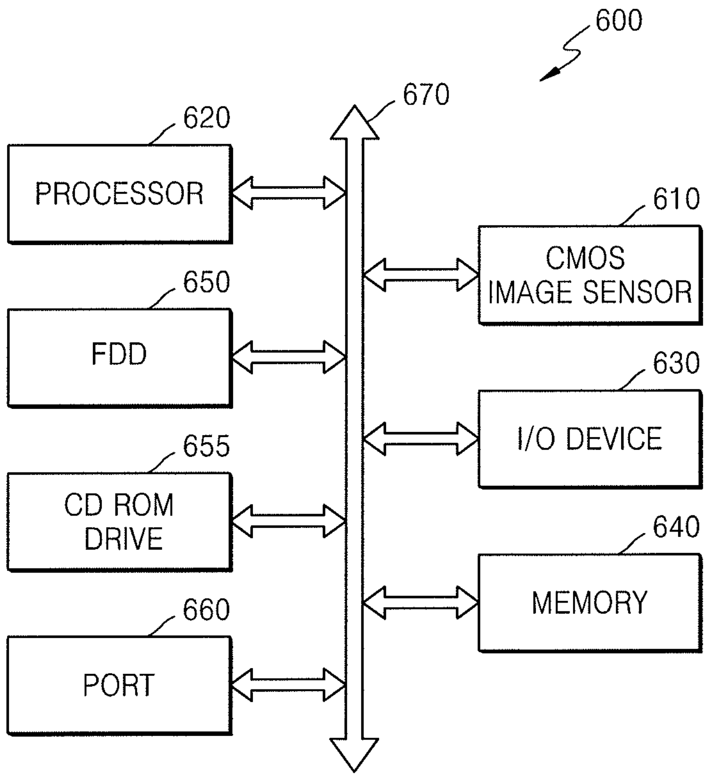
FIG. 26 illustrates a schematic block diagram of an electronic system including an image sensor according to an embodiment.

FIG. 26 is a schematic block diagram of an electronic system 600 including an image sensor according to an embodiment.

Specifically, the electronic system 600 may include a CMOS image sensor 610 and configured to process an output image of the CMOS image sensor 610. For example, the electronic system 600 may be any system (e.g., a computer, a camera system, a scanner, an image stabilization system), which may include the CMOS image sensor 610.

The electronic system 600 may include a processor 620, an input/output (I/O) device 630, a memory 640, a floppy disk drive 650, and a CD ROM drive 655, which may communicate with one another via a bus 670. The CMOS image sensor 610 may include one of the image sensors shown in FIGS. 1 to 5 and 7 to 17.

The CMOS image sensor 610 may receive a control signal or data from the processor 620 or another device of the electronic system 600. The CMOS image sensor 610 may provide a signal defining an image based on the received control signal or data. The processor 620 may process signals received from the image sensor 610.

The processor 620 may serve to execute a program and control the electronic system 600. The processor 620 may be, for example, a microprocessor, a digital signal processor, a microcontroller, or a device similar thereto.

The I/O device 630 may be used to input or output data to and from the electronic system 600. The electronic system 600 may be connected to an external apparatus (e.g., a personal computer (PC) or a network) by using the I/O device 630 and exchange data with the external apparatus. The I/O device 630 may be, for example, a keypad, a keyboard, or a display.

The memory 640 may store codes and/or data for operations of the processor 620 and/or store data processed by the processor 620. A port 560 may be connected to a video card, a sound card, a memory card, or a universal serial bus (USB) device or communicate data with another system.

One or more embodiments may provide an image sensor capable of improving a degree of isolation between photoelectric converters within a unit pixel by including a device isolation structure between photoelectric converters within a unit pixel. The device isolation structure may have a different form factor, e.g., shape, width, depth, and so forth, than a pixel isolation structure provided between unit pixels.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An image sensor, comprising:
- a semiconductor layer including a first surface and a second surface, which are opposite to each other;
- a plurality of unit pixels located in the semiconductor layer, each unit pixel including a first photoelectric converter and a second photoelectric converter;
- a first isolation layer to isolate adjacent unit pixels from one another; and
- a second isolation layer between the first photoelectric converter and the second photoelectric converter,
- wherein the first isolation layer includes an insulating material in a first isolation trench and the second isolation layer include an insulating material in a second isolation trench, and
- wherein the first isolation trench has a different shape from the second isolation trench.

2. The image sensor as claimed in claim 1, wherein:
- the first isolation layer and the second isolation layer extend from the second surface toward the first surface of the semiconductor layer, and
- the first isolation layer is closer to the first surface of the semiconductor layer than to the second isolation layer.

3. The image sensor as claimed in claim 1, wherein:
- the first isolation layer and the second isolation layer extend from the first surface toward the second surface of the semiconductor layer, and
- the first isolation layer is closer to the second surface of the semiconductor layer than to the second isolation layer.

4. The image sensor as claimed in claim 1, wherein:
- the first isolation layer and the second isolation layer have a first width and a second width, respectively, and
- the first width is greater than the second width.

5. The image sensor as claimed in claim 1, wherein;
- the first isolation layer and the second isolation layer have a first width and a second width, respectively, and
- the first width is smaller than the second width.

6. The image sensor as claimed in claim 1, wherein the first isolation layer includes a material having a lower refractive index than a material included in the semiconductor layer.

7. The image sensor as claimed in claim 1, further comprising a third isolation layer intersecting the second isolation layer, the third isolation layer located in the first photoelectric converter and the second photoelectric converter.

8. The image sensor as claimed in claim 7, wherein two ends of the second isolation layer and two ends of the third isolation layer are in contact with the first isolation layer.

9. The image sensor as claimed in claim 7, wherein two ends of the second isolation layer and two ends of the third isolation layer are spaced apart from the first isolation layer.

10. The image sensor as claimed in claim 7, wherein an intersection region at which the second isolation layer intersects the third isolation layer is spaced a predetermined distance from a center toward an edge of the unit pixel.

11. The image sensor as claimed in claim 1, further comprising:
- an interconnection layer on the first surface of the semiconductor layer; and
- a color filter layer and a microlens (ML) layer on the second surface of the semiconductor layer.

12. An image sensor comprising:
- a substrate having a first surface and a second surface, which are opposite to each other, the substrate including a pixel array region in which a plurality of unit pixels are arranged;
- a pixel isolation region including an insulating material in a pixel isolation trench, the pixel isolation region to isolate adjacent unit pixels from one another;
- an interconnection layer on the first surface of the substrate; and
- a color filter layer and a microlens (ML) layer on the second surface of the substrate, wherein each of the unit pixels includes:
- at least two photoelectric converters; and
- a device isolation region between the first surface and the second surface of the substrate, the device isolation region including a device isolation trench, and
- wherein the pixel isolation trench has a different width or depth from the device isolation trench.

13. The image sensor as claimed in claim 12, wherein the device isolation region includes ions of a material of a different conductivity type from a conductivity type of the photoelectric converter.

14. The image sensor as claimed in claim 12, wherein the device isolation region includes an insulating material in the device isolation trench.

15. The image sensor as claimed in claim 14, wherein the device isolation region comprises:
- a second isolation layer to isolate the at least two photoelectric converters from one another; and
- a second device isolation layer in each of the photoelectric converters.

16. An image sensor, comprising:
- a semiconductor layer including a first surface and a second surface, which are opposite to each other;
- a plurality of unit pixels in the semiconductor layer between the first and second surfaces, each unit pixel including a first photoelectric converter and a second photoelectric converter;
- a first isolation structure to isolate adjacent unit pixels from one another, the first isolation structure extending between the first and second surfaces; and
- a device isolation structure between the first photoelectric converter and the second photoelectric converter, the device isolation structure extending between the first and second surfaces;
- wherein at least one of the device isolation structure and the first isolation structure is coplanar with only one of the first and second surfaces.

17. The image sensor as claimed in claim 16, wherein the first isolation structure forms a rectangular ring on at least one of the first and second surfaces.

18. The image sensor as claimed in claim 16, wherein, in a plane parallel with the first and second surfaces, the first isolation structure extends along three sides of the first and second photoelectric converters and the device isolation structure extends along a fourth side thereof.

* * * * *